United States Patent [19]
Tsukude et al.

[11] Patent Number: 6,011,428
[45] Date of Patent: Jan. 4, 2000

[54] VOLTAGE SUPPLY CIRCUIT AND SEMICONDUCTOR DEVICE INCLUDING SUCH CIRCUIT

[75] Inventors: Masaki Tsukude; Masanori Hayashikoshi, both of Hyogo-ken, Japan

[73] Assignee: Mitsubishi Denki Kabushiki Kaisha, Tokyo, Japan

[21] Appl. No.: 08/135,650

[22] Filed: Oct. 14, 1993

[30] Foreign Application Priority Data

| Oct. 15, 1992 | [JP] | Japan | 4-276393 |
| Oct. 23, 1992 | [JP] | Japan | 4-285986 |
| Jan. 11, 1993 | [JP] | Japan | 5-002233 |
| Jun. 28, 1993 | [JP] | Japan | 5-157565 |

[51] Int. Cl.$^7$ ..................................................... G05F 1/10
[52] U.S. Cl. ........................... 327/541; 327/540; 323/316
[58] Field of Search .................................. 327/535, 537, 327/540, 541; 323/316

[56] References Cited

U.S. PATENT DOCUMENTS

| 4,484,331 | 11/1984 | Miller | 327/540 |
| 4,613,809 | 9/1986 | Skovmand | 327/540 |
| 4,677,369 | 6/1987 | Bowers et al. | 327/542 |
| 4,954,769 | 9/1990 | Kalthoff | 327/542 |
| 5,087,891 | 2/1992 | Cytera | 327/537 |
| 5,103,158 | 4/1992 | Cho et al. | 327/537 |
| 5,153,500 | 10/1992 | Yamamoto et al. | 327/542 |
| 5,249,155 | 9/1993 | Arimoto et al. | 365/222 |
| 5,339,272 | 8/1994 | Tedrow et al. | 327/540 |

FOREIGN PATENT DOCUMENTS

| 28 30 826 A1 | 1/1980 | Germany . |
| 3830573 | 4/1989 | Germany . |
| 38 06 968 A1 | 7/1989 | Germany . |
| 4124427 | 12/1992 | Germany . |
| 4226047 | 2/1993 | Germany . |
| 4226048 | 2/1993 | Germany . |
| 56-63237 | 5/1981 | Japan . |
| 59-70217 | 5/1984 | Japan . |
| 2-245810 | 10/1990 | Japan . |
| 3-196317 | 8/1991 | Japan . |

OTHER PUBLICATIONS

Watanabe, Yohji et al., "On–Chip Supply Voltage Conversion System and Its Application to a 4Mb DRAM", Conference on Solid State Devices and Materials, 1986, pp. 307–310, no month.

Hidaka, Hideto et al., "A 34–ns 16–Mb DRAM with Controllable Voltage Down–Converter", IEEE Journal of Solid–State Circuits, Jul. 1992, pp. 1020–1027.

Horiguchi, Masashi et al., "Dual–Regulator Dual–Decoding–Trimmer DRAM Voltage Lmiiter for Burn–in Test", IEEE Journal of Solid–State Circuits, Nov. 1991, pp. 1544–1549.

*Primary Examiner*—Terry D. Cunningham
*Attorney, Agent, or Firm*—McDermott, Will & Emery

[57] ABSTRACT

The level shifter circuit of an internal down converter includes a P channel MOS transistor constituting a resistance component, and a resistor constituting a resistance component. The temperature coefficient of resistance component is set larger than the temperature coefficient of resistance component so that the output voltage of level shifter circuit has a negative temperature characteristic. If a reference voltage generated by reference voltage generation circuit decreases when operating at a high temperature, the output voltage of level shifter circuit decreases as well. Thus, change in an internal voltage due to change in the operation temperature can be compensated.

26 Claims, 18 Drawing Sheets

CHARACTERISTICS OF AN
INTERNAL DOWN CONVERTER

F I G. 1 1
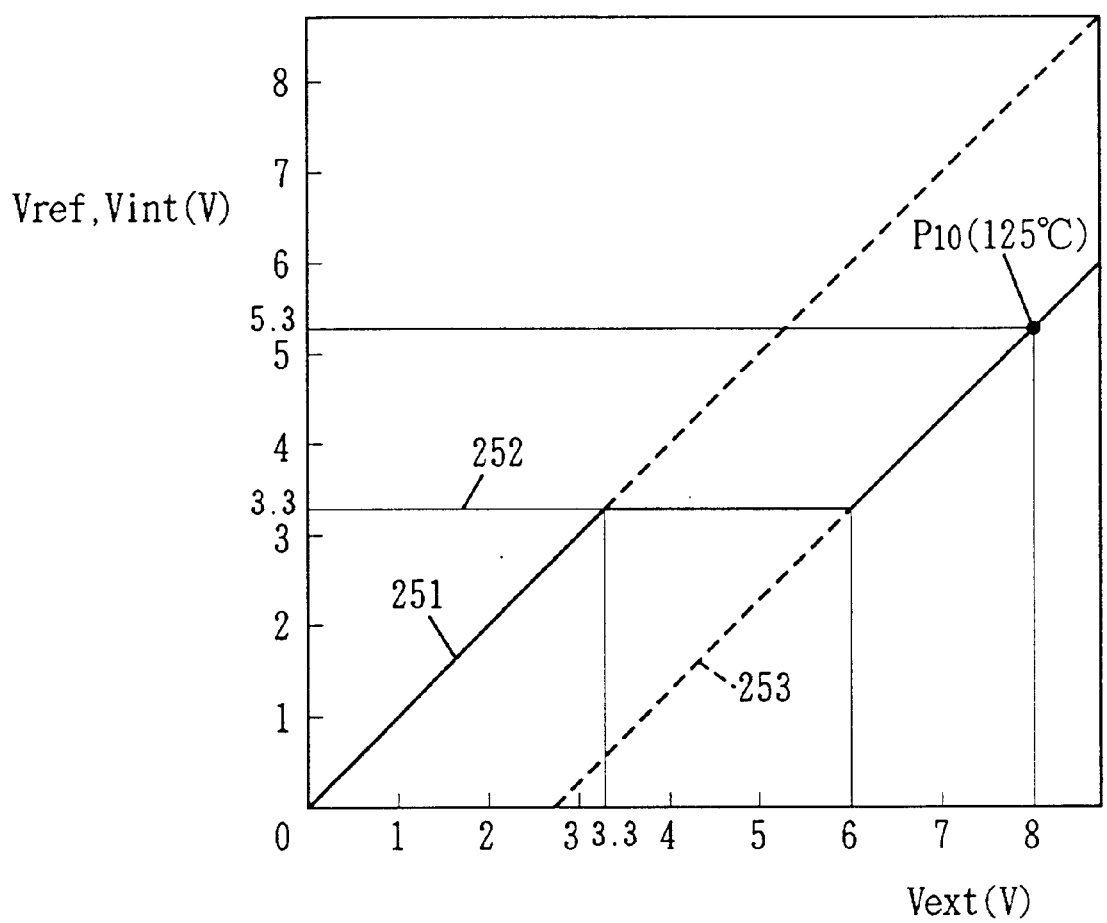

F I G. 1 2
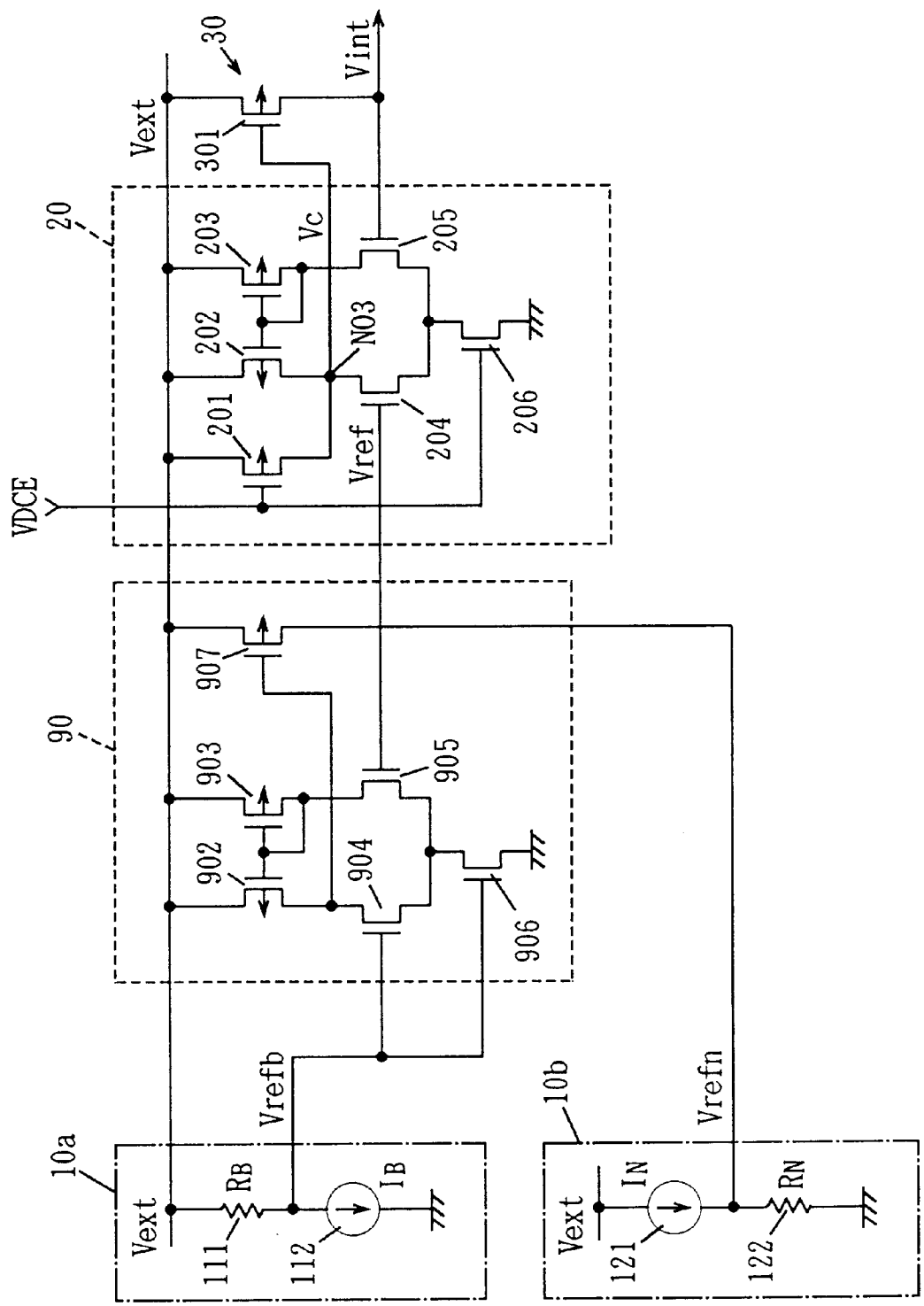

F I G. 1 3
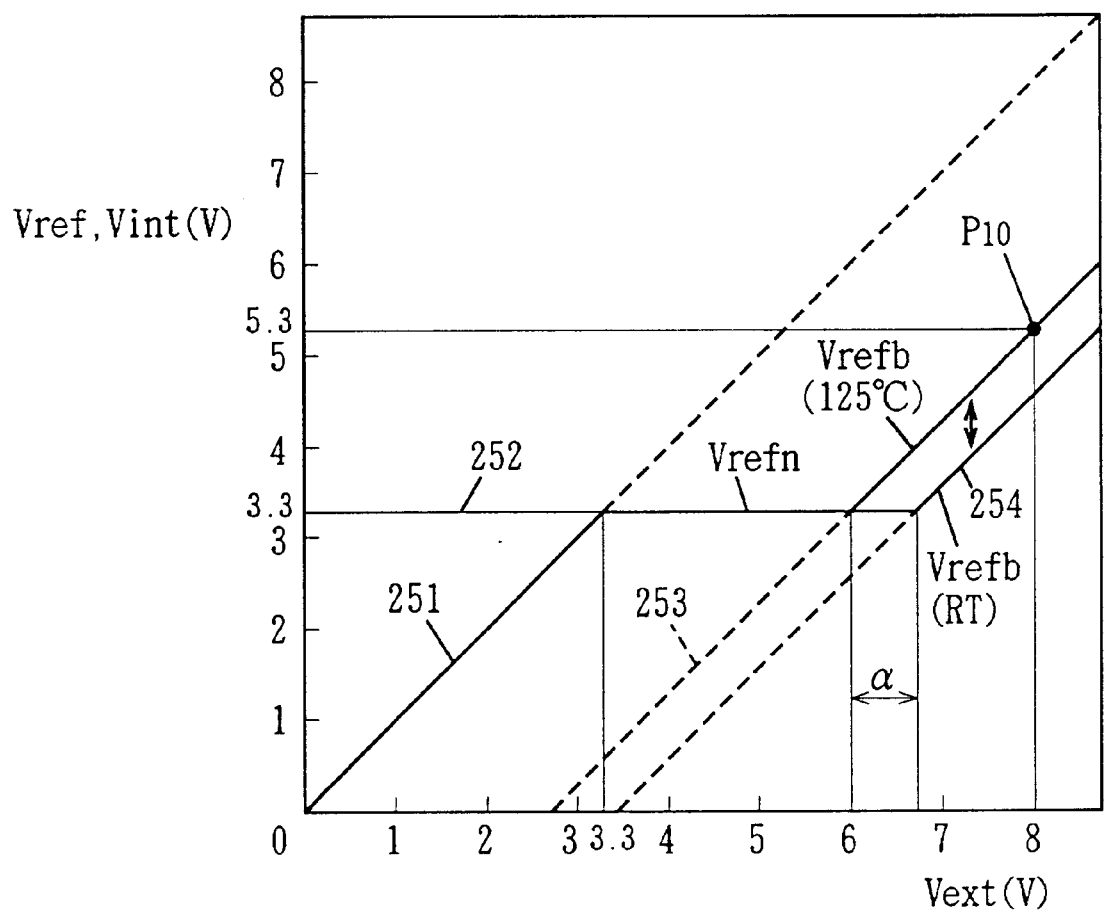

VOLTAGE SUPPLY CIRCUIT AND SEMICONDUCTOR DEVICE INCLUDING SUCH CIRCUIT

CROSS-REFERENCE TO RELATED APPLICATION

This application is related to copending application Ser. No. 819,208 filed Jan. 10, 1992, commonly assigned with the present invention.

BACKGROUND OF THE INVENTION

1. Field of the Invention

The present invention relates generally to voltage supply circuits, and more specifically, to a voltage supply circuit built in a semiconductor device.

2. Description of the Background Art

As the integration density of dynamic semiconductor memory devices increased, the gate oxide films of transistors have become thin, and therefore supplying external power supply voltage directly to internal circuits should be avoided in view of reliability. Besides, if an internal circuit is directly driven by external power supply voltage, power consumption increases. For these reasons, 16M bit DRAMs (Dynamic Random Access Memories) have a built-in internal down converter for down-converting external power supply voltage in a chip for supply to an internal circuit.

Such an internal down converter permits electric field to be applied to the gate oxide film of a transistor to be relaxed, thereby increasing reliability. The discharge current of the internal circuit is reduced by the decrease of the power supply voltage and power consumption is reduced.

FIG. 8 is a circuit diagram showing the structure of a conventional internal down converter.

The internal down converter shown in FIG. 8 includes a reference voltage generation circuit 10, a differential amplification circuit 20, a driver circuit 30 and a level shifter circuit 40.

Reference voltage generation circuit 10 includes P channel MOS transistors 101–107. Transistors 101, 102, and 103 are connected in series between a power supply line L1 receiving an external power supply voltage Vext and a ground line receiving a ground potential. Each of transistors 101, 102, and 103 are diode-connected. Transistors 104, 105, 106, and 107 are also connected in series between power supply line L1 and the ground line. Each of transistor 104, 105, 106, and 107 are also diode-connected. The gate of transistor 104 is connected to a node N1 between transistors 102 and 103.

Transistor 103 has a large impedance and a voltage (Vext–2 Vtp) is output to node N1. Herein, Vtp is a threshold voltage for a P channel MOS transistor. The potential difference between the gate and source of transistor 104 becomes 2 Vtp irrespective of the external power supply voltage Vext. Accordingly, transistor 104 operates as a constant current source.

Therefore, a reference voltage Vref is output to a node N2 between transistors 104 and 105 by combining the constant current source and diode-connected transistors 105, 106, and 107. The reference voltage Vref is equal to 3 Vtp.

Differential amplification circuit 20 includes P channel MOS transistors 201, 202, 203 and N channel MOS transistors 204, 205, 206. Transistors 202, 203, 204 and 205 constitute a current mirror circuit. The reference voltage Vref is applied to the gate of transistor 204 from reference voltage generation circuit 10, while the output voltage of level shifter circuit 40 is applied to the gate of transistor 205.

Transistor 201 is connected between power supply line L1 and a node N3. Transistor 206 is connected between a node N4 and the ground line. A control signal VDCE is applied to the gates of transistors 201 and 206.

When the control signal VDCE is in an "H" level, differential amplification circuit 20 is activated. Differential amplification circuit 20 compares the output voltage of level shifter circuit 40 to the reference voltage Vref from reference voltage generation circuit 10 and outputs a signal of an "H" or "L" level to node N3. When the output voltage of level shifter circuit 40 is lower than the reference voltage Vref from reference voltage generation circuit 10, a signal of "L" level is output to node N3. If the output voltage of level shifter circuit 40 is higher than the reference voltage Vref from reference voltage generation circuit 10, a signal of "H" level is output to node N3.

When the control signal VDCE is in an "L" level, differential amplification circuit 20 is deactivated. In this case, transistor 201 is turned on, and node N3 is charged to "H".

Driver circuit 30 includes a P channel MOS transistor 301. Transistor 301 is connected between power supply line L1 and a power supply line L5, with its gate being connected to the node N3 of differential amplification circuit 20.

Driver circuit 30 is activated when the output signal of differential amplification circuit 20 is in an "L" level, and deactivated when the output signal of differential amplification circuit 20 is in an "H" level. An internal voltage Vint is supplied to power supply line L5 by driver circuit 30.

Level shifter circuit 40 includes P channel MOS transistors 401 and 402. Transistors 401 and 402 are connected in series between power supply line L5 and the ground line.

A node N5 between transistors 401 and 402 is connected to the gate of transistor 205 in differential amplification circuit 20. A control signal /VDCE is applied to the gate of transistor 401. The control signal /VDCE is the inverse of the control signal VDCE. Transistor 402 is diode-connected.

Level shifter circuit 40 is activated when the control signal /VDCE is in an "L" level, and deactivated when the control signal /VDCE is in an "H" level. Level shifter circuit 40 resistance-divides the internal voltage Vint by the channel resistors R1 and R2 of transistors 401 and 402, and outputs the resistance-divided output voltage to node N5. The output voltage is decided by the ratio of channel resistors R1 and R2.

An operation of the internal down converter shown in FIG. 9 will be described by referring to the characteristics of the internal down converter shown in FIG. 8.

The reference voltage Vref (=3 Vtp) is generated by reference voltage generation circuit 10. Assuming that a threshold voltage Vtp for a P channel MOS transistor is 0.9 V, the reference voltage Vref is 2.7 V. The external power supply voltage Vext is, for example, 5 V.

Level shifter circuit 40 is activated when the control signal /VDCE is in an "L" level. The ratio of channel resistors R1 and R2 of transistors 401 and 402 is so set that an output voltage 2.7/4 times as large as the internal voltage Vint is supplied to node N5. In this case, if the internal voltage Vint is 4 V, the output voltage of node N5 is 2.7 V.

Differential amplification circuit 20 is activated when the control signal VDCE is in an "H" level. Reference voltage generation circuit 10 compares the output voltage of node N5 of level shifter circuit 40 to the reference voltage Vref (=2.7 V) from reference voltage generation circuit 10.

When the output voltage of node N5 is smaller than 2.7 V, in other words when the internal voltage Vint is smaller than 4 V, the signal of node N3 attains an "L" level. Thus, transistor 301 in driver circuit 30 is turned on, and power supply line L5 is charged with the external power supply voltage Vext. As a result, the internal voltage Vint increases.

When the output voltage of node N5 is larger than 2.7 V, in other words when the internal voltage Vint is larger than 4 V, the signal of node N3 attains an "H" level. Thus, transistor 301 in driver circuit 30 is turned off. As a result, supply of the external power supply voltage Vext to power supply line L5 stops.

By repeating the above-stated operation, if the external power supply voltage Vext is at least 4 V, as illustrated in FIG. 9, the internal voltage Vint is held at 4 V. If the external power supply voltage Vext is smaller than 4 V, the internal voltage Vint is equal to the external power supply voltage Vext.

Meanwhile, in semiconductor manufacturing factories, various pre-shipment tests are conducted in order to find semiconductor devices with initial failures and prevent the faulty devices from being shipped. Burn-in test is commonly conducted as one of such tests before shipment, in which a test semiconductor device is operated under a power supply voltage higher than a designed usual power supply voltage and at a high ambient temperature for a long period of time.

For a semiconductor device such as DRAM, an external power supply voltage of 5.0 V is supplied at an ambient temperature in the range from 0° C. to 70° C. in normal operation, and an external power supply voltage of 8.0 V is supplied at an ambient temperature of 125° C. in a burn-in test. An internal down-converter (or voltage supply circuit) taking into account such a burn-in test will be described in the following.

FIG. 10 is a block diagram showing an internal down converter taking into account a burn-in test. FIG. 10 illustrates the background of the present invention. Referring to FIG. 10, internal down converter 100 includes a reference voltage generation circuit for burn-in test 10a', a reference voltage generation circuit for usual operation 10b', a voltage selection circuit 90, a differential amplification circuit 20, and a driver circuit 30.

Reference voltage generation circuits 10a' and 10b' are each supplied with an external power supply voltage (5.0 V for example) Vext and generate a reference voltage Vrefb for burn-in test and a reference voltage Vrefn for normal operation, respectively. The reference voltages Vrefb and Vrefn are applied to voltage selection circuit 90. voltage selection circuit 90 compares the applied voltages Vrefb and Vrefn and selectively applies the higher one of them as a reference voltage Vref to differential amplification circuit 20.

Differential amplification circuit 20 is activated in response to a control signal VDCE and performs a differential operation in response to the applied reference voltage Vref and an internal voltage (or internal power supply voltage) Vint. Driver circuit 30 outputs the internal voltage Vint in response to a control voltage Vc output from differential amplification circuit 20. The output voltage Vint is supplied as an internal power supply voltage to an internal circuit (not shown) and is also applied to differential amplification circuit 20.

FIG. 11 is a representation showing voltage characteristics for use in illustration of the relation between the external power supply voltage Vext and the reference voltage Vref selected by voltage selection circuit 90 shown in FIG. 10. Referring to FIG. 11, the abscissa represents the external power supply voltage vext (V), while the ordinate represents the reference voltage Vref (V). In FIG. 11, the polygonal line (or curve) in solid line represents the voltage selected by selection circuit 90 shown in FIG. 10, in other words represents the reference voltage Vref applied to differential amplification circuit 20.

In FIG. 11, straight line 251 represents a relation Vref=Vext, straight line 252 Vref=3.3 V (constant), and straight line 253 represents Vref=Vext−2.7 V.

When the external power supply voltage Vext<3.3 V, the reference voltage Vref equal to the external power supply voltage Vext is output. Accordingly, in this range, the reference voltage Vref is present on straight line 251.

Voltage selection circuit 90 shown in FIG. 10 selectively outputs the higher one of the applied two voltages Vrefb and Vrefn. Therefore, when 3.3≦Vext≦6.0(V), a predetermined voltage of 3.3 V is output as the reference voltage Vref.

Differential amplification circuit 20 shown in FIG. 10 controls driver circuit 30 to make the internal voltage Vint equal to the reference voltage Vref, in response to the internal voltage or internal power supply voltage Vint and the applied reference voltage Vref. Driver circuit 30 controls the level of the internal voltage Vint in response to the control voltage Vc applied from differential amplification circuit 20.

Accordingly, when 3.3 V≦Vext≦6.0 V as illustrated in FIG. 11, since the reference voltage Vref of 3.3 V (constant) is applied to differential amplification circuit 20, in this range, the voltage Vint of 3.3 V (constant) is supplied as the internal power supply voltage to the internal circuit (not shown).

When, for example, a certain semiconductor device operates in a normal operation mode, an external power supply voltage Vext of 5.0 V is applied, and its internal down converter 100 supplies a voltage Vint of 3.3 V (constant) as an internal power supply voltage to the internal circuit.

As described above, a circuit configuration for burn-in test should be taken into account in a semiconductor device. For example, internal down converter 100 shown in FIG. 10 has a special characteristic for burn-in test shown in FIG. 11. Referring back to FIG. 11, when an external power supply voltage Vext of 8.0 V is supplied, voltage selection circuit 90 shown in FIG. 10 outputs a reference voltage Vref of 5.3 V (see point P10). More specifically, if the external power supply voltage Vext varies in the range represented by 6.0 V<Vext, the reference voltage Vref is present on straight line 253 representing Vref=Vext−2.7 V. Stated differently, the characteristic shown in FIG. 11 is provided for the relation between voltage selection circuit 90, and reference voltage generation circuits 10a' and 10b' shown in FIG. 10, in order to satisfy the conditions (point P10) for the above-described burn-in test in the range of 6.0 V<Vext.

Accordingly, internal down converter 100 shown in FIG. 10 can supply the voltage Vint of 3.3 V (constant) as the internal power supply voltage only when 3.3V<Vext<6.0 V. Stated differently, when 6.0 V<Vext, the internal voltage Vint higher than 3.3 V is output, and the following disadvantage is encountered in the internal circuit which is not shown.

Referring back to FIG. 8, the internal down converter operates at a high temperature (about in the range from 70° C. to 80° C.), the threshold voltage Vtp of the channel MOS transistor is reduced by about 0.07 V compared to its operating at a room temperature (for example at 25° C.). Therefore, the reference voltage Vref (=3 Vtp) decreases at the time of high temperature operation by about 0.21 V as compared to at the time of room temperature operation.

Accordingly, the reference voltage Vref is 2.49 V when operating at a high temperature.

In this case, since differential amplification circuit 20 controls driver circuit 30 so that the output voltage of level shifter circuit 40 is equal to 2.49 V, the internal voltage Vint becomes 2.49·(4/2.7)=3.69 [V] when operating at a high temperature. Thus, the internal voltage Vint decreases at the time of high temperature operation by significant 0.31 V as compared to at the time of room temperature operation.

As a result, in a semiconductor memory device having an internal down converter as shown in FIG. 8 built therein, accessing speed is reduced by the decrease of the internal voltage Vint.

In a conventional internal down converter, when the reference voltage Vref generated by reference voltage generation circuit 10 changes in accordance with changes in parameters in a process, the internal voltage Vint supplied by driver circuit 30 changes as well. When the reference voltage Vref increases the internal voltage Vint increases, and when the reference voltage Vref decreases, the internal voltage Vint decreases as well.

For example, if the reference voltage Vref changes by 0.1 V, the internal voltage Vint changes by the amount of 0.1×(4/2.7)=0.15 [V]. Thus, in the conventional internal down converter, an undesirable change in the internal voltage in accordance with a change in parameters in a process is encountered.

Meanwhile, as has already been pointed out about internal down converter 100 shown in FIG. 10, internal down converter 100 can supply a desired internal voltage Vint (=3.3 V) to the internal circuit (not shown) only when 3.3V≦Vext≦6.0 V as shown in FIG. 11. If an external power supply voltage Vext higher than 6.0 V is supplied at an ambient temperature for normal operation, as can be seen from FIG. 11, a voltage Vint higher than 3.3 V will be supplied to the internal circuit as the internal power supply voltage.

Generally, when a power supply voltage in excess of a designed power supply voltage level is supplied to a semiconductor integrated circuit, an erroneous operation timing is generated in the semiconductor integrated circuit. More specifically, when a power supply voltage having a higher level is supplied, transistors (including field effect transistors and bipolar transistors) forming the semiconductor integrated circuit operate faster than usual. This suggests that in some cases a designed operation timing in some circuit can not be obtained.

In order to avoid this problem, a designed internal power supply voltage of 3.3 V (constant) should be supplied to the internal circuit (not shown), which necessitates the accepted range of the external power supply voltage Vext being 3.3V≦Vext≦6.0 V. In other words, in order to satisfy the conditions for burn-in test (point P10 shown in FIG. 11), the range of the external power supply voltage Vext which can be supplied to internal down converter 100 shown in FIG. 10 is limited, which makes it difficult to obtain sufficient margin for supplying the external power supply voltage Vext.

SUMMARY OF THE INVENTION

It is an object of the invention to provide a voltage supply circuit capable of supplying a desired internal output voltage stably irrespective of operation temperatures.

Another object of the invention is to provide an internal down converter capable of supplying a desired internal voltage stably if parameters in a process change.

Yet another object of the invention is to provide a voltage supply circuit capable of supplying a desired internal voltage stably irrespective of operation temperatures and supplying a desired internal voltage even if parameters in a process change.

A still further object of the invention is to provide a voltage supply circuit capable of operating in a wider range of externally applied power supply voltage, while taking into account execution of burn-in test.

A voltage supply circuit in accordance with the invention includes a reference voltage generation circuit, a driver circuit, a voltage dividing circuit and a comparison circuit.

The reference voltage generation circuit is driven by an external power supply voltage and generates a reference voltage. The driver circuit receives the external power supply voltage and supplies an internal output voltage. The voltage dividing circuit includes first and second resistance components, and resistance-divides the internal output voltage supplied by the driver circuit by the first and second resistance components to supply a prescribed output voltage. The comparison circuit compares the divided output voltage supplied by the voltage dividing circuit to the reference voltage generated by the reference voltage generation circuit and controls the driver circuit based on the difference between the divided output voltage and the reference voltage.

The first and second resistance components of the voltage dividing circuit have resistance values of different temperature coefficients so that it can compensate for a change in the internal output voltage according to a change in the operation temperature.

When the operation temperature changes, the reference voltage generated by the reference voltage generation circuit changes as well, and the output of the comparison circuit changes as a result. Thus, the internal output voltage supplied by the driver circuit also changes.

In the internal down converter, the first and second resistance components of the voltage dividing circuit have different resistance values so as to compensate changes in the internal output voltage by a change in the operation temperature. Accordingly, when the operation temperature changes, the dividing ratio of the voltage dividing circuit changes, and the divided output voltage supplied by the voltage dividing circuit changes. Consequently, change in the reference voltage generated by the reference voltage generation circuit is compensated by change in the output voltage supplied by the voltage dividing circuit, and the internal output voltage supplied from the driver circuit becomes a prescribed value.

For example, it is assumed that the reference voltage decreases if the operation temperature increases. In this case, the temperature coefficients of the first and second resistance components are so set that the divided output voltage supplied from the voltage dividing circuit has a negative temperature characteristic. Thus, if the operation temperature increases, the divided output voltage applied to the comparison circuit and the reference voltage both decrease. As a result, the internal output voltage supplied by the driver circuit is kept constant irrespective of the operation temperature. Accordingly, the operation speed of the internal circuit is restrained from slowing down when the temperature is high.

If the temperature coefficients of the first and second resistance circuits are so set that the divided output voltage supplied by the voltage dividing circuit when the temperature is high is higher than the reference voltage generated by the reference voltage generation circuit when the temperature is high, the internal output voltage is higher at a high temperature than at a room temperature. As a result, the delay of the operation speed of the internal circuit is further restricted at a high temperature.

As described above, change in the reference voltage by change in the operation temperature is compensated by change in the output voltage of the voltage dividing circuit, which makes it possible to supply a desired internal voltage stably irrespective of the change in the operation temperature. Consequently, the delay of the accessing speed of the internal circuit at a high temperature can be restricted.

An internal down converter in accordance with another aspect of the invention includes a reference voltage generation circuit, a driver circuit, a voltage dividing circuit, a comparison circuit, and an adjustment circuit (trimming circuit).

The reference voltage generation circuit is driven by an external power supply voltage and generates a reference voltage. The driver circuit receives the external power supply voltage and supplies an internal power supply voltage to the internal circuit. The voltage dividing circuit resistance-divides the internal voltage supplied by the driver circuit and supplies a prescribed output voltage. The comparison circuit compares the output voltage supplied by the voltage dividing circuit to the reference voltage generated by the reference voltage generation circuit, and controls the driver circuit based on the difference between the output voltage and the reference voltage. The adjustment circuit adjusts the dividing ratio of the voltage dividing circuit.

If the reference voltage generated by the reference voltage generation circuit changes due to a change in parameters in a process, the output of the comparison circuit changes as well. Thus, the internal power supply voltage supplied by the driver circuit also changes.

In the internal down converter, the dividing ratio of the voltage dividing circuit can be adjusted by the adjustment circuit. Therefore, when the reference voltage generated by the reference voltage generation circuit changes by change in parameters in a process, the output voltage supplied by the voltage dividing circuit can be adjusted by the adjustment circuit.

As a result, change in the internal power supply voltage due to change in the parameter in a process can be compensated by adjustment of the output voltage of the voltage dividing circuit.

In the above-stated manner, the dividing ratio of the voltage dividing circuit can be adjusted by the adjustment circuit, which makes it possible to supply a desired internal voltage stably even if parameters in a process change.

A voltage supply circuit according to another aspect of the invention includes a reference voltage generation circuit, a driver circuit, a voltage dividing circuit, a comparison circuit and an adjustment circuit.

The reference voltage generation circuit is driven by an external power supply voltage and generates a reference voltage. The driver circuit receives the external power supply voltage and supplies an internal output voltage. The voltage dividing circuit includes first and second resistance components and resistance-divides the internal output voltage supplied by the driver circuit by the first and second resistance components and supplies a prescribed output voltage. The comparison circuit compares the divided output voltage supplied by the voltage dividing circuit to the reference voltage generated by the reference voltage generation circuit and controls the driver circuit based on the difference between the divided output voltage and the reference voltage.

The adjustment circuit adjusts at least one resistance value of the first and second resistance components of the voltage dividing circuit. The first and second resistance components of the voltage dividing circuit have resistance values of different temperature coefficients so that change in the internal output voltage by change in the operation temperature can be compensated for.

In the internal down converter, change in the internal output voltage by change in the operation temperature can be compensated for, and change in the internal output voltage by change in parameters in a process can be compensated for.

Therefore, stable supply of a desired internal output voltage is permitted irrespective of change in the operation temperature, and yet stable supply of a desired internal output voltage is permitted even if parameters in a process change.

A voltage supply circuit according to the invention includes first and second reference voltage generation circuits, a voltage selection circuit, and an output circuit.

The first reference voltage generation circuit generates a first reference voltage increasing in proportion to externally applied power supply voltage and in response to increase in ambient temperature. The second reference voltage generation circuit generates a second reference voltage independent of the externally applied power supply voltage. The voltage selection circuit is connected to receive the first and second reference voltages and selectively outputs the higher one of the first and second reference voltages. The output circuit supplies the voltage output from the voltage selection circuit to an internal circuit.

In operation, the first reference voltage generation circuit generates the first reference voltage increasing as a function of the increase of the ambient temperature. Stated differently, the first reference voltage decreases as a function of the decrease of the ambient temperature. The voltage selection circuit selectively outputs the higher one of the first and second reference voltages. More specifically, the voltage selection circuit selectively outputs the first reference voltage generated from the first reference voltage generation circuit, when a burn-in test is made at a high ambient temperature. Meanwhile, the voltage selection circuit selectively outputs the second reference voltage generated from the second reference voltage generation circuit, when a normal operation at a lower ambient temperature is possible. Accordingly, in the normal operation mode at the lower ambient temperature, the second reference voltage independent of the externally applied power supply voltage can be applied to the output circuit through the voltage selection circuit, and therefore a desired voltage can be supplied to the internal circuit in a wider range of the externally applied power supply voltage.

A voltage supply circuit according to the invention includes first and second reference voltage generation circuits, a voltage selection circuit, and an output circuit.

The first reference voltage generation circuit generates a predetermined burn-in reference voltage at a predetermined ambient temperature for burn-in test, and generates a reference voltage lower than the burn-in reference voltage at an ambient temperature for normal operation. The second reference voltage generation circuit generates a predetermined reference voltage independent of an externally applied power supply voltage. The voltage selection circuit selectively outputs the higher one of the reference voltages generated from the first and second reference voltage generation circuits. The output circuit supplies the voltage output from the voltage selection circuit to the internal circuit.

In operation, the first reference voltage generation circuit generates a predetermined burn-in reference voltage at a predetermined ambient temperature for burn-in test, and generates a reference voltage lower than the burn-in reference voltage at an ambient temperature for normal operation. The voltage selection circuit selectively outputs the burn-in reference voltage in a burn-in test mode, and selectively outputs the predetermined reference voltage independent of an externally applied power supply voltage in a normal operation mode. Accordingly, a desired power supply voltage in a wider range of the externally applied power supply voltage can be supplied to the internal circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a circuit diagram showing the structure of a peripheral circuit/internal down converter for stand-by;

FIG. 11 is a representation showing voltage characteristic for use in illustration of the relation between external power supply voltage Vext and reference voltage Vref selected by a voltage selection circuit shown in FIG. 10;

FIG. 12 is a circuit diagram showing an internal down converter according to a fifth embodiment of the invention;

FIG. 13 is a representation showing voltage characteristic for use in illustration of the relation between external power supply voltage Vext and reference voltage Vref selected by a voltage selection circuit shown in FIG. 12;

DESCRIPTION OF THE PREFERRED EMBODIMENTS (1) First Embodiment

Figure 1:
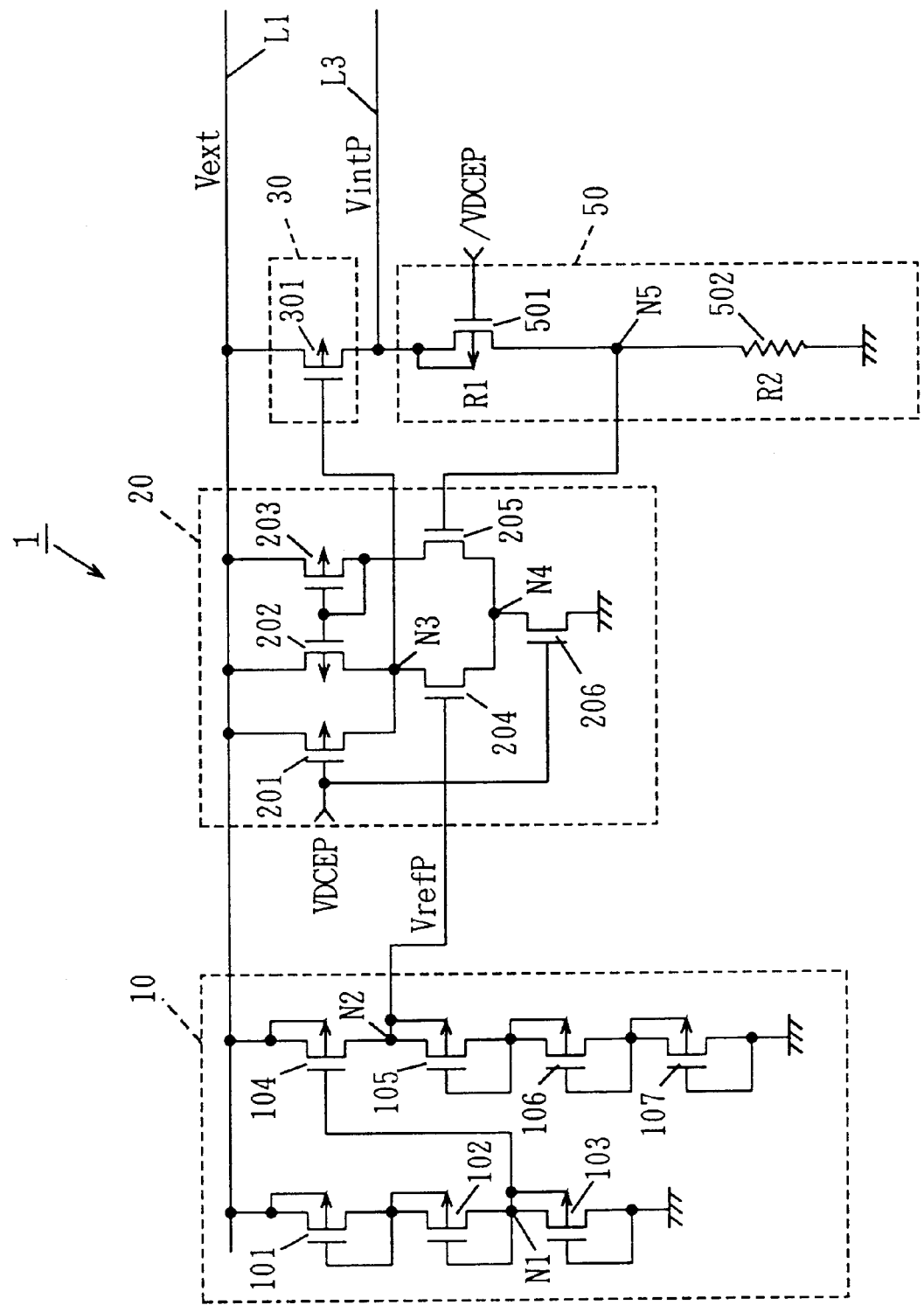
FIG. 1 is a circuit diagram showing the structure of an internal down converter in accordance with the first embodiment.
Figure 8:
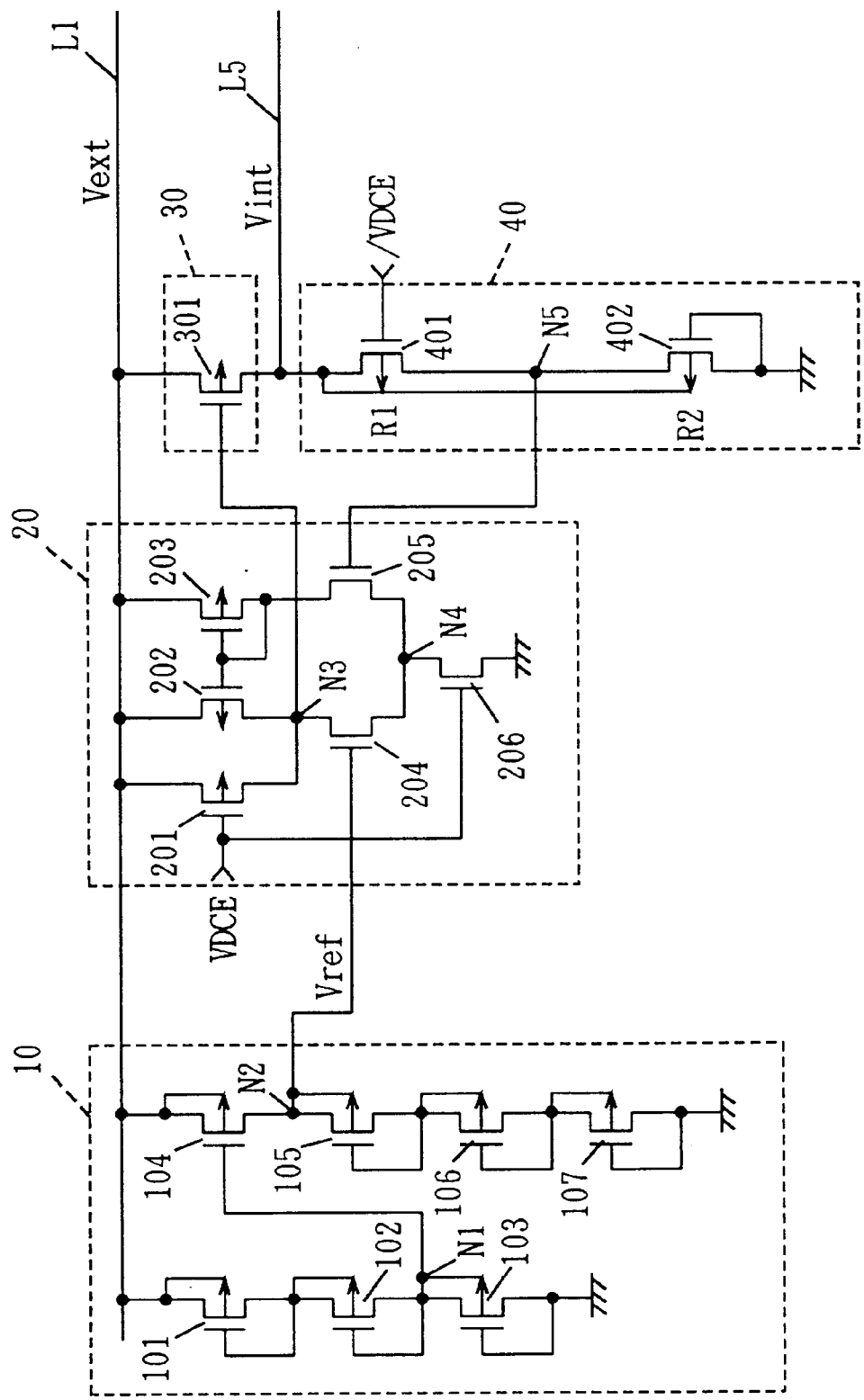
FIG. 8 is a circuit diagram showing the structure of a conventional internal down converter.
Figure 9:
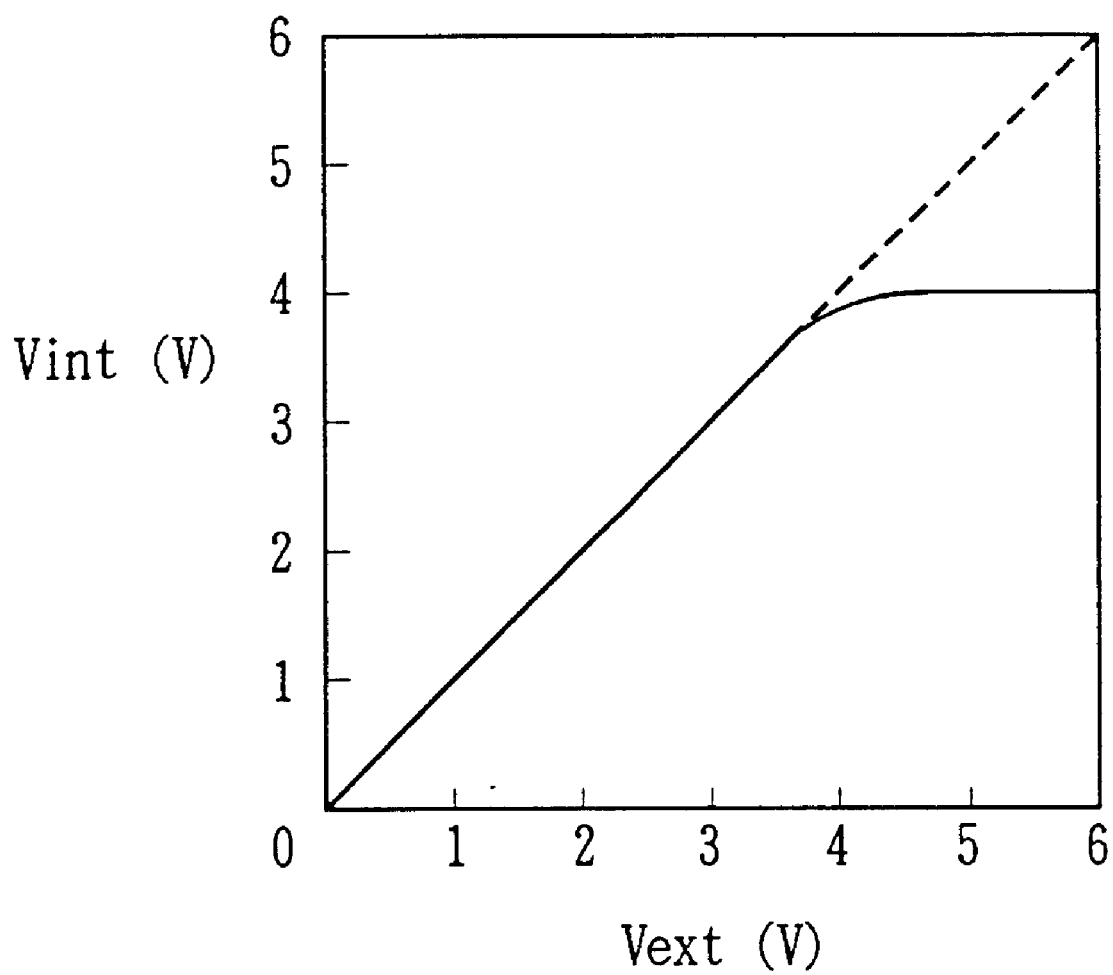
FIG. 9 is a circuit diagram showing the characteristics of an internal down converter.

With reference to FIG. 1, internal down converter 1 includes a reference voltage generation circuit 10, a differential amplification circuit 20, a driver circuit 30 and a level shifter circuit 50. The structure and operation of reference voltage generation circuit 10, differential amplification circuit 20 and driver circuit 30 are the same as the structure and operation of reference voltage generation circuit 10, differential amplification circuit 20 and driver circuit 30 shown in FIG. 8.

An internal voltage VrefP output from a node N2 in reference voltage generation circuit 10 and applied to the gate of a transistor 204 in differential amplification circuit 20. A control signal VDCEP is applied to the gate of a transistor 201 in differential amplification circuit 20.

Level shifter circuit 50 includes a P channel MOS transistor 501 and a resistor 502. Transistor 501 is connected between a power supply line L3 and a node N5, and resistor 502 is connected between node N5 and a ground line. Node N5 is connected to the gate of a transistor 205 in differential amplification circuit 20. A control signal /VDCEP is applied to the gate of transistor 501.

Transistor 501 has a resistance component R1, and resistor 502 has a resistance component R2. The temperature coefficient $\alpha_1$ of resistance component R1 is set larger than the temperature coefficient $\alpha_2$ of resistance component R2. Resistor 502 is formed of, for example, polysilicon. For example, the temperature coefficient $\alpha_1$ of resistance component R1 is $4 \times 10^{31\ 3}$ [/° C.], while the temperature coefficient $\alpha_2$ of resistance component R2 is $-5 \times 10^{-4}$ [/° C.].

Now, operation of internal down converter 1 shown in FIG. 1 will be described. The basic operation of internal down converter 1 shown in FIG. 1 is the same as the operation of the conventional internal down converter shown in FIG. 7, and therefore, a further description will not be provided.

At a room temperature (25° C.), the resistance value $R_1$ of resistance component R1 in level shifter circuit 50 is set to be 13 KΩ, and the resistance value $R_2$ of resistance component R2 to 27 KΩ. Therefore, when the internal voltage VintP is 4 V, 2.7 V is output to node N5 in level shifter circuit 50.

At a high temperature (80° C.), the resistance value $R_1'$ of resistance component R1 and the resistance value $R_2'$ of resistance component R2 are given as follows:

$$R_1' = R_1 \cdot (1 + \alpha_1 \cdot \Delta T) \tag{1}$$

$$R_2' = R_2 \cdot (1 + \alpha_2 \cdot \Delta T) \quad (2)$$

where $\alpha_1$ represents the temperature coefficient of resistance component R1, $\alpha_2$ the temperature coefficient of the resistance component R2, and $\Delta T$ the temperature difference between an operation temperature and a reference temperature (room temperature). In this example, since $R_1 = 13 [K\Omega]$, $R_2 = 27 (K\Omega]$, $\alpha_1 = 4 \times 10^{-3} [/° C.]$, $\alpha_2 = -5 \times 10^{-4} [/° C.]$, and $\Delta T = 80 - 25 = 55 [° C.]$, $R_1' = 15.9 [K\Omega]$ and $R_2' = 26.3 [K\Omega]$ are given.

Thus, if the internal voltage VintP is 4 V, the output voltage of node N5 of level shifter circuit 50 operating at a high temperature is given as follows:

$$4 \times 26.3 \times 10^3 / (15.9 \times 10^3 + 26.3 \times 10^3) = 2.49 [V]$$

Meanwhile, as described above, the reference voltage VrefP when operating at a high temperature is 2.49 V. Accordingly, the output voltage of level shifter circuit 50 is equal to the reference voltage Vref. Consequently, both when operating at a room temperature and at a high temperature, the internal voltage VintP supplied by driver circuit 30 becomes constant at 4 V level and is supplied stably. Therefore, the delay in the access speed of the semiconductor memory device when operating at a high temperature can be reduced.

It is noted that the resistance values and temperature coefficient of resistance components R1 and R2 in level shifter circuit 50 are not limited to the above-described example. If the resistance values and temperature coefficient of resistance components R1 and R2 in level shifter circuit 50 are set so as to satisfy the following equation, the internal voltage VintP becomes constant both when operating at a room temperature and at a high temperature.

$$Vi \cdot \frac{R_2 \cdot (1 + \alpha_2 \cdot \Delta T)}{R_1 \cdot (1 + \alpha_1 \cdot \Delta T) + R_2 \cdot (1 + \alpha_2 \cdot \Delta T)} = Vr \cdot (1 + \alpha_3 \cdot \Delta T) \quad (3)$$

where $R_1$ represents the resistance value of the resistance component R1 at a reference temperature, and $R_2$ represents the resistance value of resistance component R2 at the reference temperature. $\alpha_1$ represents the temperature coefficient of resistance component R1, $\alpha_2$ the temperature coefficient of resistance component R2, and $\alpha_3$ the temperature coefficient of the reference voltage. Vi represents the internal voltage at the reference temperature, while Vr the reference voltage at the reference temperature. $\Delta T$ represents the difference between the operation temperature and the reference temperature. The temperature coefficient $\alpha_3$ of the reference voltage is given by the following equation:

$$\alpha_3 = \Delta V / Vr \cdot \Delta T \quad (4)$$

$\Delta V$ represents the amount of change in the reference voltage, $\Delta T$ the amount of change in the operation temperature, and Vr the reference voltage at the reference temperature.

If the resistance values and temperature coefficients of resistance components R1 and R2 in level shifter circuit 50 are set so as to satisfy equations (3) and (4), a constant internal voltage is supplied irrespective of the operation temperature.

In the above-described example, since the reference voltage VrefP generated by reference voltage generation circuit 10 has a negative temperature characteristic, the materials of resistance components R1 and R2 are so selected that the output voltage of level shifter circuit 50 also has a negative temperature characteristic. In this case, the temperature coefficient $\alpha_1$ of resistance component R1 is set larger than the temperature coefficient $\alpha_2$ of resistance component R2.

If the reference voltage VrefP generated by reference voltage generation circuit 10 has a positive temperature characteristic, the materials of resistance components R1 and R2 are so selected that the output voltage of level shifter circuit 50 also has a positive temperature characteristic. In this case, the temperature coefficient $\alpha_1$ of resistance component R1 is set smaller than the temperature coefficient $\alpha_2$ of resistance component R2.

If the resistance values and temperature coefficient of resistance components R1 and R2 in level shifter circuit 50 are so set that the output voltage of node N5 in level shifter circuit 50 when operating at a high temperature is higher than the reference voltage Vref when operating at a high temperature, the internal voltage VintP when operating at a high temperature can made higher than 4 V. As a result, the delay in the accessing speed of the semiconductor memory device when operating at a high temperature can further be reduced.

The internal voltage generated by the internal down converter according to the first embodiment may be supplied as internal power supply voltage to internal circuitry such as peripheral circuit and memory array, or as reference voltage or driving voltage to the internal circuitry.

(2) Second Embodiment

Figure 2:
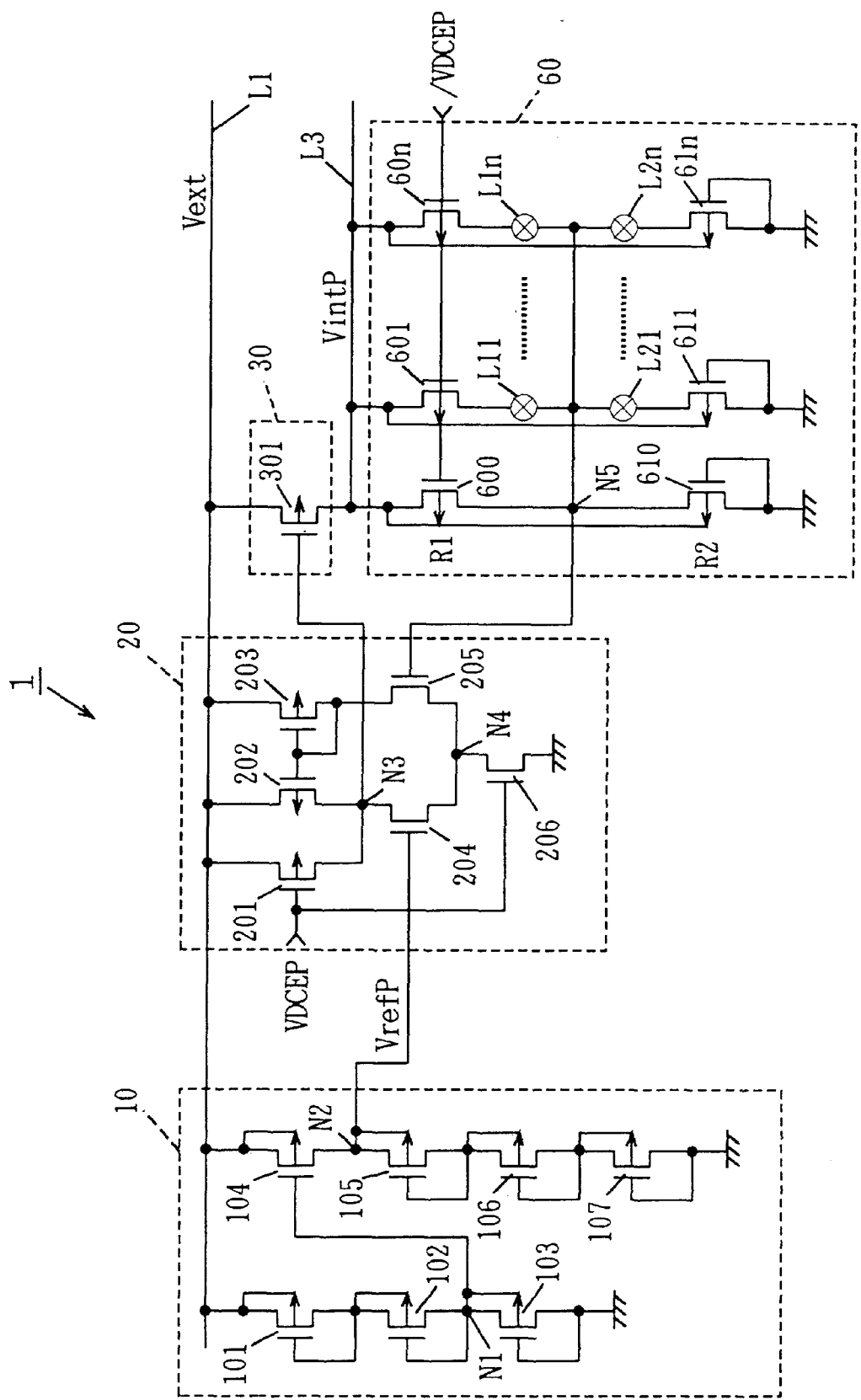
FIG. 2 is a circuit diagram showing the structure of an internal down converter in accordance with a second embodiment.

FIG. 2 is a circuit diagram showing the structure of an internal down converter 1 in accordance with a second embodiment.

Internal down converter 1 shown in FIG. 2 includes a reference voltage generation circuit 10, a differential amplification circuit 20, a driver circuit 30 and a level shifter circuit 60. The structure and operation of reference voltage generation circuit 10, differential amplification circuit 20 and driver circuit 30 are the same as the structure and operation of reference voltage generation circuit 10, differential amplification circuit 20 and driver circuit 30 shown in FIGS. 1 and 7.

Level shifter circuit 60 includes P channel MOS transistors 60₀–60n, 61₀–61n, and fuse links L1₁–L1n, L2₁–L2n. Transistors 60₀–60n constitute a resistance component R1 on charge side. Transistors 61₀–61n constitute a resistance component R2 on discharge side. Transistor 60₀ is connected between a power supply line L3 and a node N5, and transistor 61₀ is connected in series between node N5 and a ground line. Transistor 60₁ and fuse link L1₁ are connected in series between power supply line L3 and node N5, and fuse link L2₁ and transistor 61₁ are connected in series between node N5 and the ground line. Similarly, transistor 60n and fuse link L1n are connected in series between power supply line L3 and node N5, and fuse link L2n and transistor 61n are connected in series between node N5 and the ground line.

Node N5 is connected to the gate of a transistor 205 in differential amplification circuit 20. A control signal /VDCEP is applied to the gate of transistors 60₀–60n. Transistors 61₀–61n are each diode-connected. Each of fuse links L1₁–L1n, L2₁–L2n can be blown by a laser beam.

Now, the operation of internal down converter 1 shown in FIG. 2 will be described. The basic operation of internal down converter 1 is identical to the conventional internal down converter, and therefore the description thereof will be omitted.

A reference voltage VrefP generated by reference voltage generation circuit becomes higher than 2.7 V due to fluctuations in parameters in a process, an internal voltage VintP supplied by driver circuit 30 becomes higher than 4 V. In this case, a part or all of fuse links L21–L2n on the discharge side in level shifter circuit 60 are blown by a laser beam. Thus, the resistance value of resistance component R2 on the discharge side is set so high that the output voltage of node N5 in level shifter circuit 60 is higher than 2.7 V as with the reference voltage VrefP generated by reference voltage generation circuit 10. As a result, the internal voltage VintP supplied by driver circuit 30 is set to be 4 V.

If the reference voltage VrefP generated by reference voltage generation circuit 10 becomes lower than 2.7 V due to fluctuations in parameters in a process, the internal voltage VintP supplied by driver circuit 30 becomes lower than 4 V. In this case, a part or all of fuse links L11–L1n on the charge side in level shifter circuit 60 are blown by a laser beam. Thus, the resistance value of resistance component R1 on the charge side is set so high that the output voltage of node N5 in level shifter circuit 60 becomes lower than 2.7 V as with the reference voltage VrefP generated by reference voltage generation circuit 10. Consequently, the internal voltage VintP supplied by driver circuit 30 is set to be 4 V.

Thus, when the reference voltage VrefP is increased due to the fluctuations in the parameters in the process, a part or all of fuse links L21–L2n on the discharge side in the level shifter circuit 60 are blown, and when the reference voltage VrefP decreases, a part or all of fuse links L11–L1n on the charge side in level shifter circuit 60 are blown.

The amount of change in the output voltage of node N5 in level shifter circuit 60 can arbitrarily set by the number of fuse links to be blown. Therefore, a constant stable internal voltage is always obtained even if the parameters change in the process.

In the internal down converter in the above-described embodiment, the driving capability of differential amplification circuit 20 increases as a function of increase of input voltage. Meanwhile, the sensitivility of differential amplification circuit 20 increases as the input voltage decreases. In the above embodiment, the reference voltage VrefP generated from reference voltage is set about half the external power supply voltage Vext. Thus, both relatively high driving capability and relatively high sensitivity are achieved.

The internal voltage can be set so as to satisfy the following expression.

$$Vext-M-Vpth \leq Vint \leq Vext \quad (5)$$

where Vint represents internal voltage, Vext external power supply voltage, M margin, and Vthp the threshold voltage of P channel MOS transistor 301 constituting driver circuit 30.

The internal voltage generated by the internal down converter according to the second embodiment is supplied as internal power supply voltage to internal circuitry such as peripheral circuit, memory cell array.

(3) Third Embodiment

Figure 3:
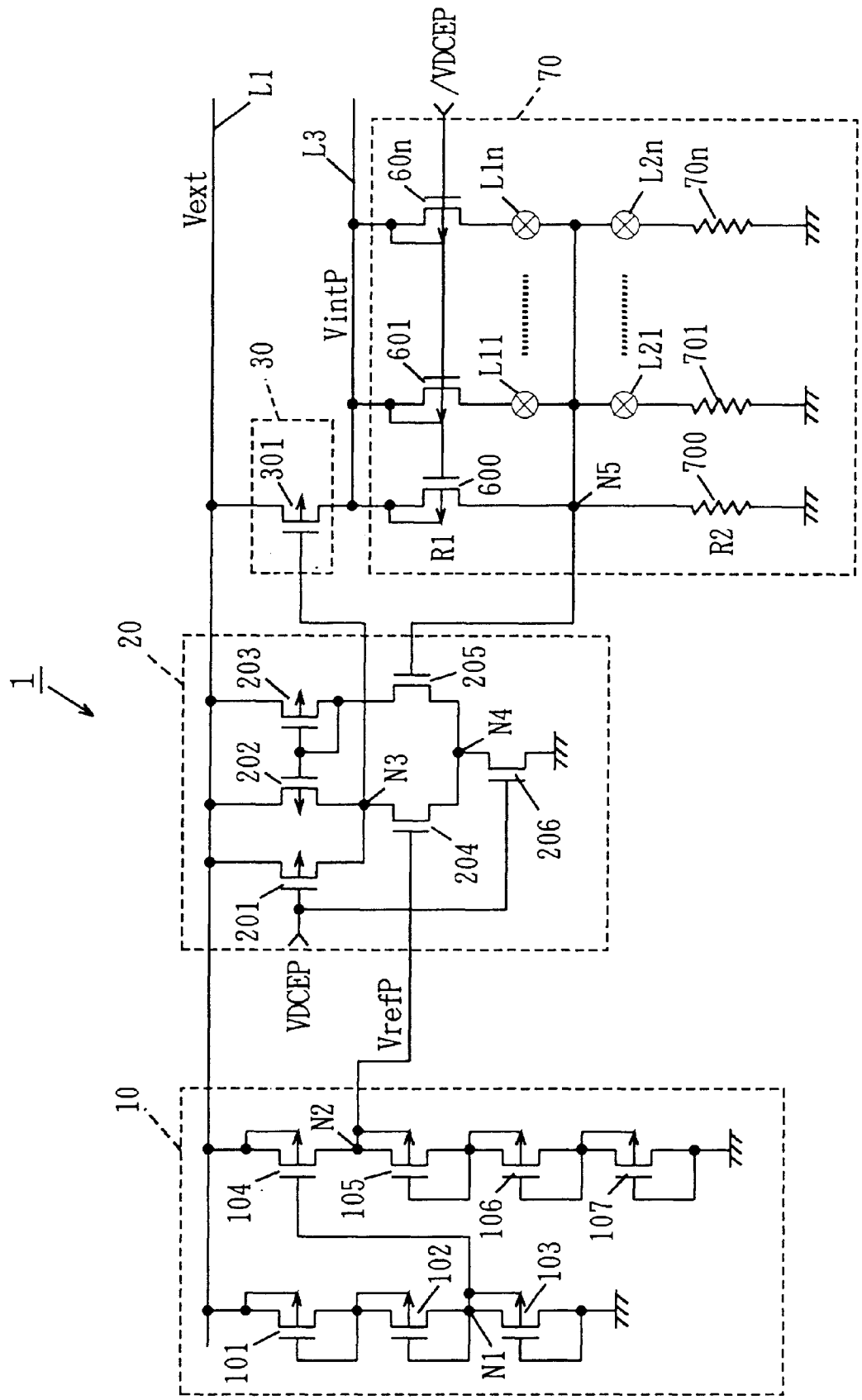
FIG. 3 is a circuit diagram showing the structure of an internal down converter in accordance with a third embodiment.

FIG. 3 is a circuit diagram showing the structure of an internal down converter 1 in accordance with a third embodiment.

Internal down converter 1 shown in FIG. 3 includes a reference voltage generation circuit 10, a differential amplification circuit 20, a driver circuit 30, and a level shifter circuit 70. The structure and operation of reference voltage generation circuit 10, differential amplification circuit 20 and driver circuit 30 are the same as the structure and operation of reference voltage generation circuit 10, differential amplification circuit 20, and driver circuit 30 shown in FIGS. 3 and 7.

Level shifter circuit 70 includes P channel MOS transistors 600–60n, resistors 700–70n, and fuse links L11–L1n, L21–L2n.

Transistors 600–60n constitute a resistance components R1 on charge side. Resistors 700–70n constitute a resistance component R2 on discharge side.

Transistor 600 is connected between a power supply line L3 and a node N5, and resistor 700 is connected in series between node N5 and a ground line. Transistor 601 and fuse link L11 are connected in series between power supply line L3 and node N5, and fuse link L21 and resistor 701 are connected in series between node N5 and the ground line. Similarly, transistor 60n and fuse link L1n are connected in series between power supply line L3 and node N5, and fuse link L2n and resistor 70n are connected in series between node N5 and the ground line.

Node N5 is connected to the gate of a transistor 205 in differential amplification circuit 20. A control signal /VDCEP is applied to the gates of transistors 600–60n. Each of fuse links L11–L1n, L21–L2n can be blown by a laser beam.

The resistance values and temperature coefficients of resistance components R1 and R2 in level shifter circuit 70 are so set that change in a reference voltage VrefP due to change in an operation temperature is compensated for as in the case of the first embodiment. Accordingly, a constant internal voltage VintP is stably supplied both when operating at a room temperature and operating at a high temperature.

When a part or all of fuse links L21–L2n on the discharge side in level shifter circuit 70 are blown by a laser beam, the resistance value of resistance component R2 on the discharge side increases, and the output voltage of node N5 in level shifter circuit 70 becomes higher than 2.7 V. When a part or all of fuse links L11–L1n on the charge side in level shifter circuit 70 are blown by a laser beam, the resistance value of resistance component R1 on the charge side increases, and the output voltage of node N5 in level shifter circuit 70 become lower than 2.7 V.

Therefore, if the reference voltage VrefP generated by reference voltage generation circuit 10 increases due to fluctuations in the parameters in a process, some or all of fuse links L21–L2n on the discharge side are blown to set the internal voltage VintP supplied by driver circuit 30 at a constant level. If the reference voltage VrefP generated by reference voltage generation circuit 10 decreases due to fluctuations in the parameters in the process, a part or all of fuse links L21–L2n on the charge side are blown, and the internal voltage VintP supplied by driver circuit 30 can be set constant.

The amount of change in the output voltage of node N5 in level shifter circuit 70 can freely be set by the number of fuse links to be blown. Accordingly, even if the parameters in a process change, a constant internal voltage is always obtained.

As described above, according to the internal down converter in accordance with the third embodiment, change in the internal voltage due change in the operation temperature and change in the internal voltage due to fluctuations in parameters in the process can be compensated.

The internal voltage generated by the internal down converter according to the third embodiment may be supplied as an internal power supply voltage to internal circuitry such as peripheral circuits, and memory array, or may be supplied to the internal circuitry as a reference voltage.

A stable internal down converter can be obtained by the second and the third embodiments compared with a fourth embodiment described later, since the number of a loop can decreased.

Now, a specific use of the internal down converter will be described.

Figure 4:
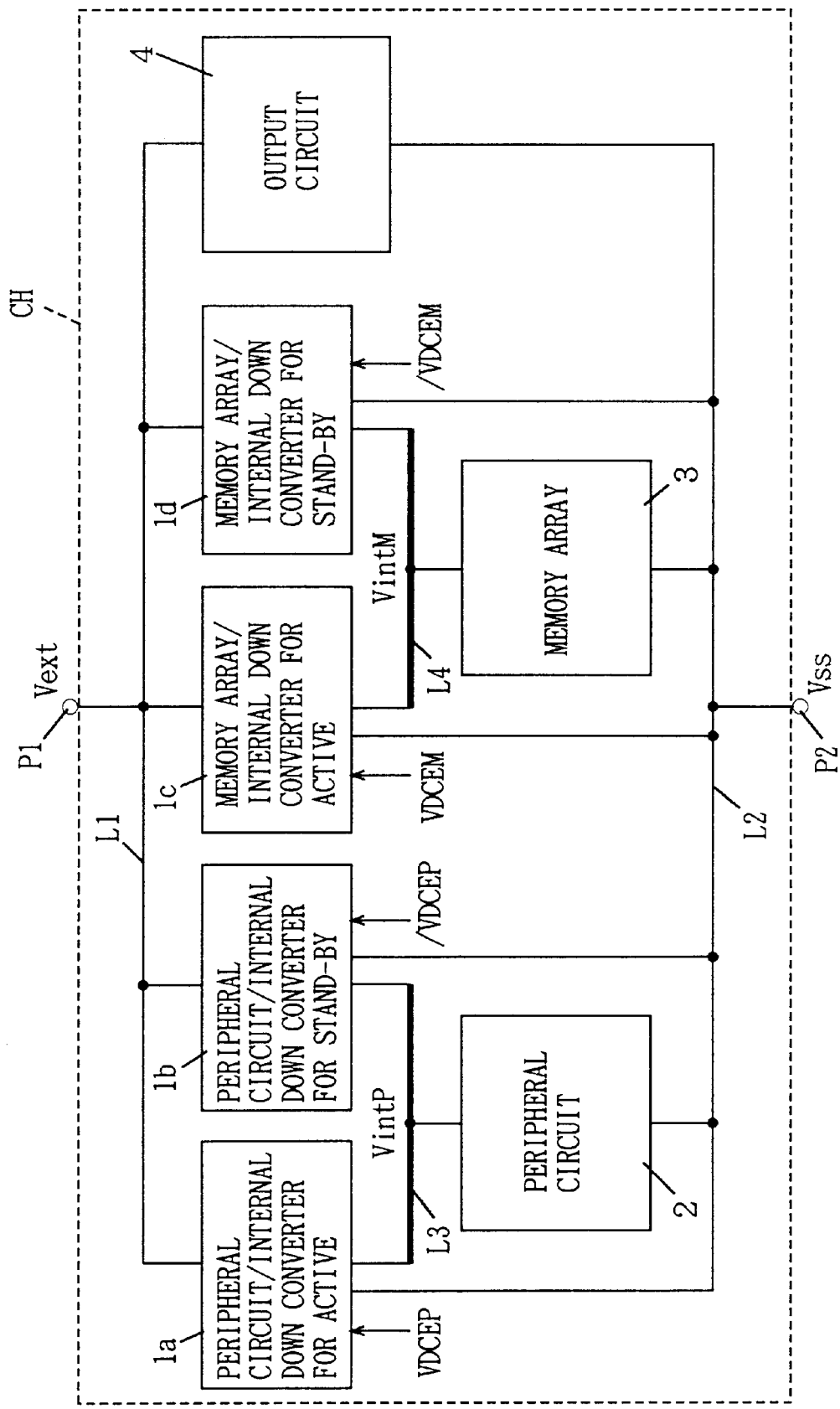
FIG. 4 is a block diagram showing the entire structure of a semiconductor memory device having built-in internal down converters in accordance with the first to third embodiments of the invention.

FIG. 4 is a block diagram showing the entire structure of a dynamic semiconductor memory device having the built-in internal down converter in accordance with the first to third embodiments.

The internal down converter includes a peripheral circuit/internal down converter for active 1a, a peripheral circuit/internal down converter for stand-by 1b, a memory array/internal down converter for active 1c, a memory array/internal down converter for stand-by 1d, a peripheral circuit 2, a memory array 3, and an output circuit 4. These circuits are formed on a semiconductor chip CH.

The internal down converter has a power supply terminal P1 receiving an external power supply voltage Vext and a ground terminal P2 receiving a ground potential Vss. Power supply terminal P1 is connected to internal down converters 1a, 1b, 1c, and 1d, and output circuit 4 through a power supply line L1. Ground terminal P2 is connected to internal down converters 1a, 1b, 1c, and 1d, peripheral circuit 2, memory array 3 and output circuit 4.

An internal voltage VintP is supplied to peripheral circuit 2 by internal down converters 1a, 1b through a power supply line L3. An internal voltage VintM is supplied to memory array 3 by internal down converters 1c, 1d through a power supply line L4. The external power supply voltage Vext is directly supplied to output circuit 4 through power supply line L1.

Peripheral circuit 2 includes a control signal buffer, a data input buffer, a decoder, an address buffer, a control circuit and the like. Memory array 3 includes a plurality of word lines, a plurality of bit lines crossing the word lines, a plurality of memory cells provided at crossover points of the bit lines and the word lines, and a plurality of sense amplifiers amplifying data read out to the plurality of bit lines. Output circuit 4 includes a data output buffer.

Internal down converter 1a is controlled by a control signal VDCEP, while internal down converter 1b is controlled by a control signal /VDCEP. The control signal /VDCEP is the inverse of the control signal VDCEP. Internal down converter 1c is controlled by a control signal VDCEM, while internal down converter 1d is controlled by a control signal /VDCEM. The control signal /VDCEM is the inverse of the control signal VDCEM. These control signals are generated by a control circuit included in peripheral circuit 2.

Figure 5:
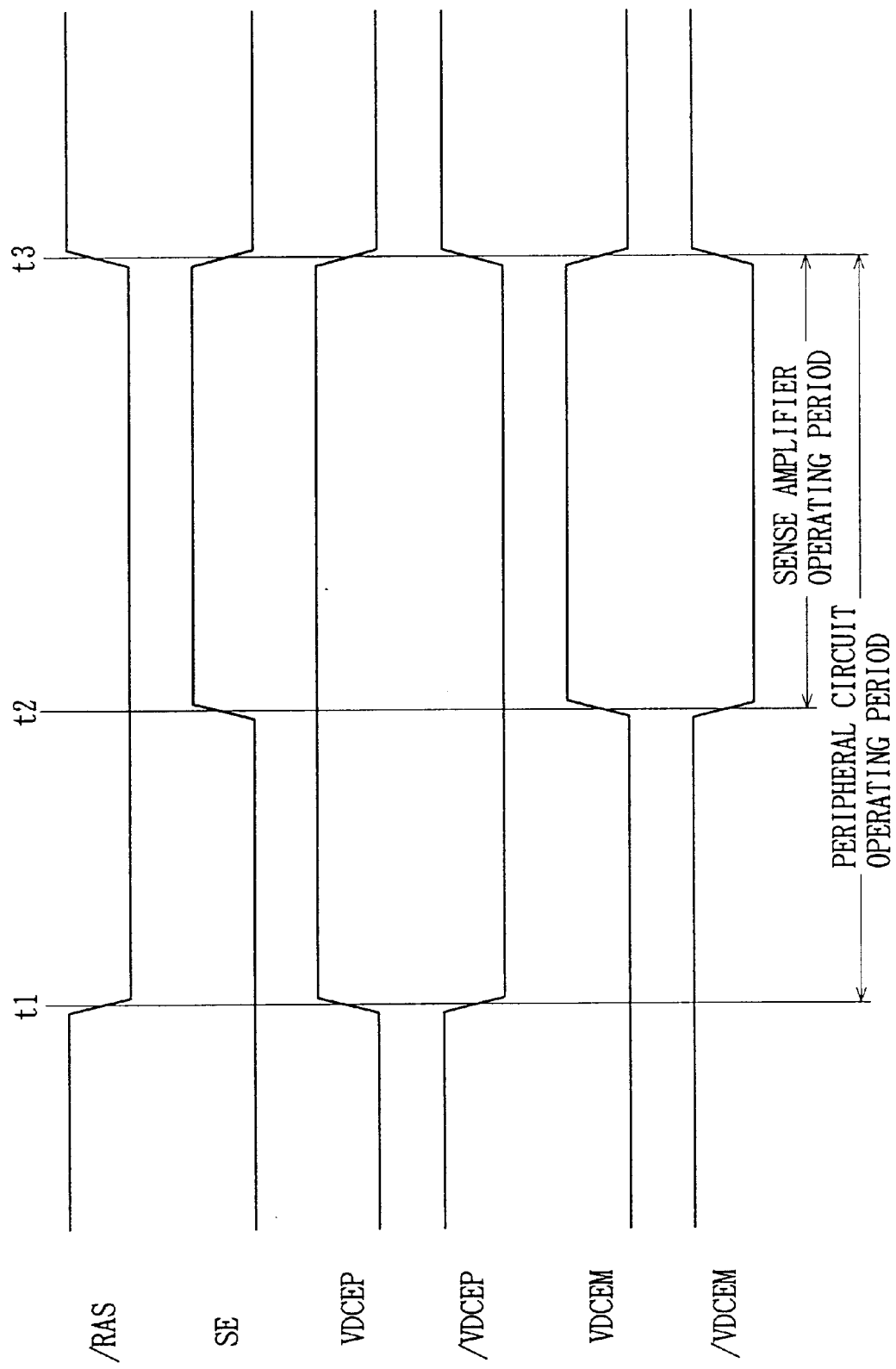
FIG. 5 is a timing chart showing a control signal for activating each internal down converter built in the semiconductor memory device shown in FIG. 4.

FIG. 5 is a timing chart of the control signals for controlling internal down converters 1a, 1b, 1c, and 1d. The active and stand-by periods of the semiconductor memory device is defined by a row address strobe signal /RAS externally applied to a control signal buffer in peripheral circuit 2. The sense amplifiers in memory array 3 are controlled by a sense amplifier activation signal SE generated from the control circuit in peripheral circuit 2.

When the row address strobe signal /RAS is in an "H" state, the semiconductor memory device attains a stand-by state, and when the row address strobe signal /RAS is an "L" state, the semiconductor memory device attains an active state. The sense amplifiers in memory array 3 are activated when the sense amplifier activation signal SE is an "H" state.

When the row address strobe signal /RAS is in an "H" state, the control signal VDCEP attains an "L" state, and the control signal /VDCEP attains an "H" level. As a result, internal down converter 1a is deactivated, and internal down converter 1b is activated. When the row address strobe signal /RAS is in an "L" state, the control signal VDCEP attains an "H" state, and the control signal /VDCEP attains an "L" state. Thus, internal down converter 1a is activated while internal down converter 1b is deactivated.

When the sense amplifier activation signal SE is in an "L" state, the control signal VDCEM attains an "L" state and the control signal /VDCEM attains an "H" state. Thus, internal down converter 1c is deactivated, while internal down converter 1d is activated. When the sense amplifier activation signal SE attains an "H" level, the control signal VDCEM is pulled to an "H" level, and the control signal /VDCEM to an "L" level. Thus, internal down converter 1c is activated, while internal down converter 1d is deactivated.

As stated above, internal down converter 1a is activated in the peripheral circuit operation period from time t1 to time t3, and internal down converter 1b is activated in the peripheral circuit non-operation period. Internal down converter 1c is activated in the sense amplifier operation period from time t2 to time t3, and internal down converter 1d is activated in the sense amplifier non-operation period.

Internal down converters 1a and 1c are formed of large-sized transistors and have good followability to change in internal voltage. Meanwhile, internal down converter 1b and 1d are formed of small sized transistors and current consumption is small. Accordingly, in an active period, internal down converters 1a and 1c having good followability to change in internal voltage are activated, while in a stand-by period internal down converters 1b and 1d with small current consumption are activated.

Figure 6:
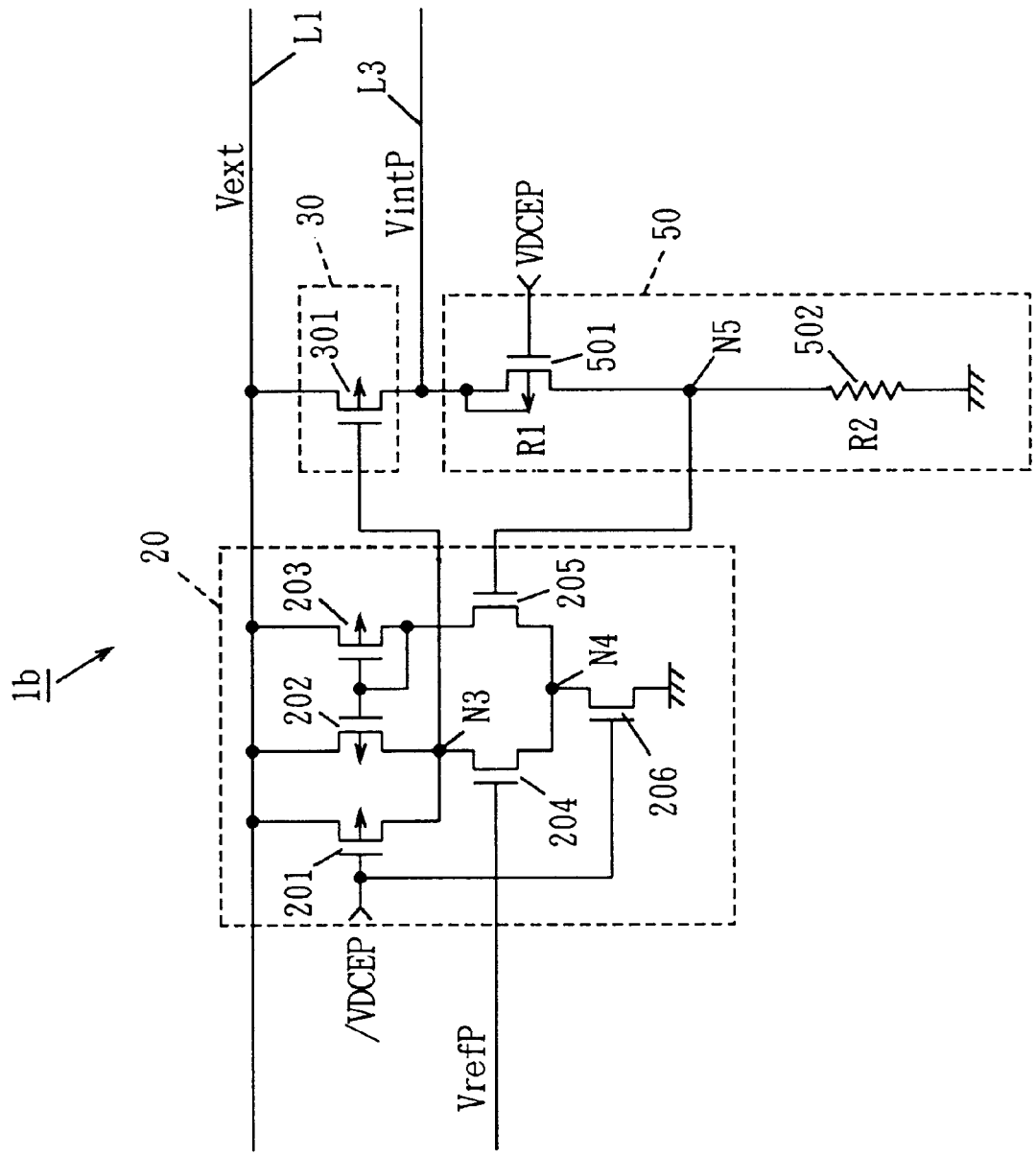

FIG. 6 is a circuit diagram showing the structure of peripheral circuit/internal down converter for stand-by 1b built in the semiconductor memory device shown in FIG. 4. Internal down converter 1b includes a differential amplification circuit 20, a driver circuit 30 and a level shifter circuit 50. The structure and operation of differential amplification circuit 20, driver circuit 30 and level shifter circuit 50 are the same as the structure and operation of differential amplification circuit 20, driver circuit 30 and level shifter circuit 50 shown in FIG. 1.

Reference voltage generation circuit 10 shown in FIG. 1 is shared by internal down converters 1a and 1b. Therefore, a reference voltage VrefP is applied from reference generation circuit 10 shown in FIG. 1 to the gate of transistor 204 in differential amplification circuit 20 shown in FIG. 6. The control signal /VDCEP is applied to the gate of transistor 201 in differential amplification circuit 20, while the control signal VDCEP is applied to the gate of transistor 501 in level shifter circuit 50.

Accordingly, when the control signal VDCEP is in an "H" state and the control signal /VDCEP "L", the differential amplification circuit 20 and level shifter circuit 50 of internal down converter 1 (corresponding 1a in FIG. 4) shown in FIG. 1 are activated, and the differential amplification circuit 20 and level shifter circuit 50 of internal down converter 1b shown in FIG. 6 are deactivated. Conversely, when the control signal VDCEP is in an "L" state and the control signal /VDCEP is in an "H" state, the differential amplification circuit 20 and level shifter circuit 50 of internal down converter 1 (corresponding 1a in FIG. 4) shown in FIG. 1 are deactivated, while the differential amplification circuit 20 and level shifter circuit 50 of internal down converter 1b shown in FIG. 6 are activated.

The differential amplification circuit 20, driver circuit 30, and level shifter circuit 50 of internal down converter 1b shown in FIG. 6 are formed of transistors smaller in size than those of internal down converter 1 (corresponding 1a in FIG. 4) shown in FIG. 1 in order to reduce stand-by current.

The structure of memory array/internal down converter 1c for active built in the semiconductor memory device shown in FIG. 4 is substantially identical to the structure of internal down converter 1 (corresponding 1a in FIG. 4) shown in FIG.

1 with a difference being that a control signal VDCEM is applied in stead of the control signal VDCEP and a control signal /VDCEM in place of the control signal /VDCEP. The structure of memory array/internal down converter for stand-by 1d built in the semiconductor memory device shown in FIG. 4 is substantially identical to the structure of internal down converter 1b shown in FIG. 6 with a difference being that the control signal /VDCEM is applied in place of the control signal /VDCEP and the control signal VDCEM in place of the control signal VDCEP.

(4) Fourth Embodiment

Figure 7:
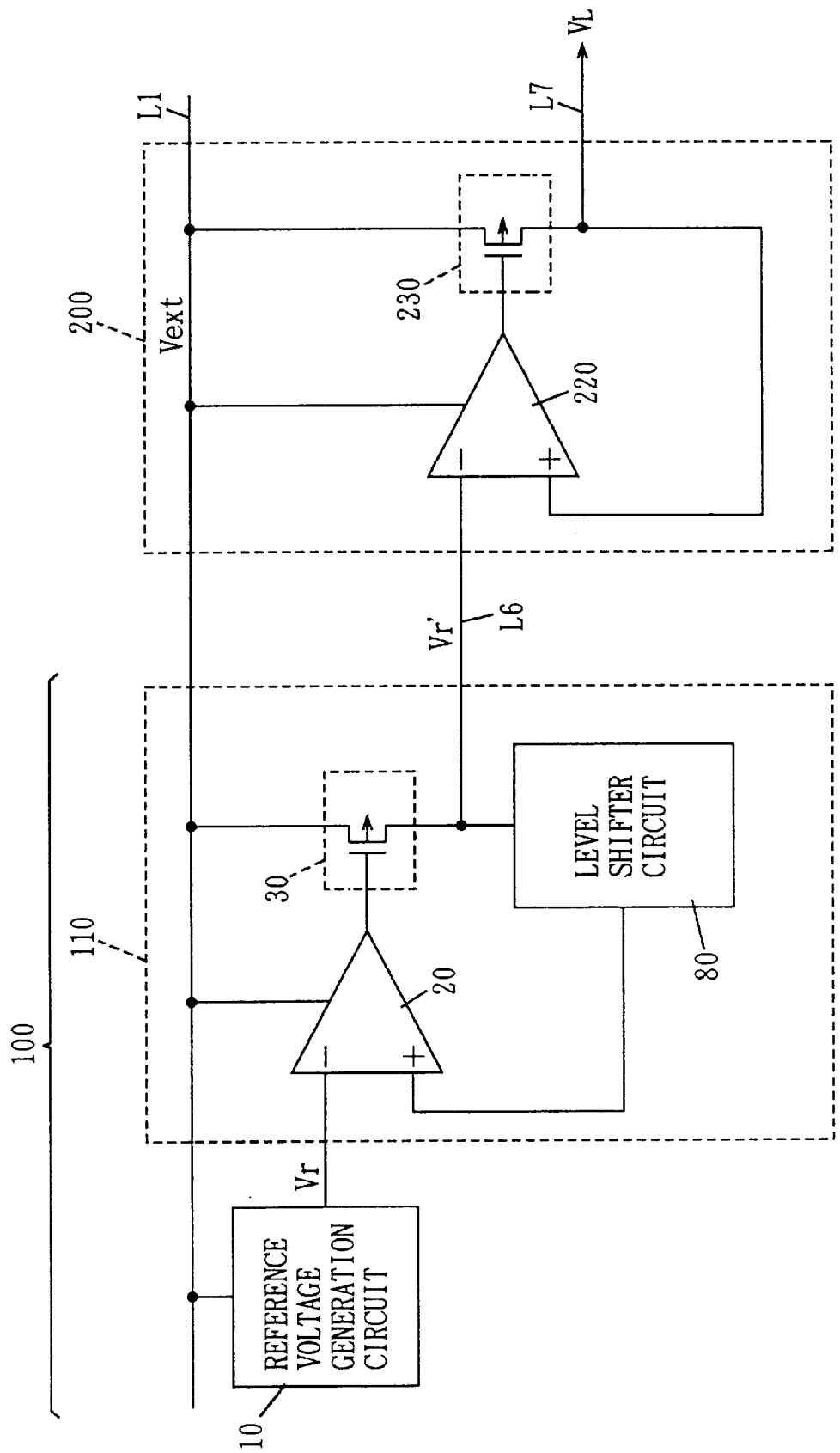
FIG. 7 is a circuit diagram showing the structure of a voltage supply circuit in accordance with a fourth embodiment.

FIG. 7 is a block diagram showing the structure of a voltage supply circuit according to a fourth embodiment of the invention.

In FIG. 7, voltage supply circuit 100 includes a reference voltage generation circuit 10 and a voltage conversion circuit 110.

Voltage conversion circuit 110 includes a differential amplification circuit 20, a driver circuit 30, and a level shifter circuit 80. The structure and operation of reference voltage generation circuit 10, differential amplification circuit 20, and driver circuit 30 are the same as those of reference voltage generation circuit 10, differential amplification circuit 20 and driver circuit 30 illustrated in FIGS. 1 and 3. The structure and operation of level shifter circuit 80 is the same as the structure and operation of level shifter circuit 50 shown in FIG. 1 or the structure and operation of level shifter circuit 70 shown in FIG. 3.

Reference voltage generation circuit 10 is driven by an external power supply voltage Vext (for example 5 V) to generate a reference voltage Vr (for example 1.1 V). Voltage conversion circuit 110 converts the reference voltage Vr to a reference voltage Vr' (for example 3.3 V), and outputs the resultant voltage to a voltage line L6. The reference voltage Vr' output from voltage conversion circuit 110 is applied to a driving circuit (buffer) 200 for enhancing the current driving capability of voltage conversion circuit 110. Driving circuit 200 responds to the reference voltage Vr' to supply an output voltage $V_L$ (3.3 V) to a voltage line L7.

Driving circuit 200 includes a differential amplification circuit 220 and a driver circuit 230. Driver circuit 230 includes a P channel MOS transistor connected between a power supply line L1 and voltage line L7. The reference voltage Vr' is applied to one input terminal of differential amplification circuit 220. The output voltage of differential amplification circuit 220 is applied to the gate of the transistor of driver circuit 230. The output voltage $V_L$ of voltage line L7 is fed back to the other input terminal of differential amplification circuit 220.

The output voltage $V_L$ is supplied to a memory array or peripheral circuitry as internal power supply voltage, driving voltage, or reference voltage.

If level shifter circuit 50 illustrated in FIG. 1 is used for level shift circuit 80, changes in reference voltage Vr' and output voltage $V_L$ due to change in operation temperature can be compensated for.

If level shifter circuit 70 shown in FIG. 3 is used for level shifter circuit 80, changes in the reference voltage Vr' and output voltage $V_L$ due to changes in operation temperature and changes in the reference voltage Vr' and output voltage $V_L$ due to changes in parameters in the process can be compensated for.

Although the number of the loop in this embodiment is increased compared with that in the second and third embodiment, the current flowing in the circuit can be decreased since differential amplification is effected in two stages.

(5) Fifth Embodiment

FIG. 12 is a circuit diagram showing an internal down converter according to a fifth embodiment of the invention. The internal down converter shown in FIG. 12 is formed in a semiconductor substrate CH as internal down converters 1a, 1b, 1c, and 1d shown in FIG. 4. Referring FIG. 12, the internal down converter includes a reference voltage generation circuit for burn-in test 10a, a reference voltage generation circuit for normal operation 10b, a voltage selection circuit 90, a differential amplification circuit 20, and a driver circuit 30.

Reference voltage generation circuit for burn-in test 10a includes a resistor 111 and a constant current source 112 connected in series between an external power supply voltage Vext and the ground potential. A reference voltage for burn-in test Vrefb is output through a common connection node of resistor 111 and constant current source 112.

Reference voltage generation circuit for normal operation 10b includes a constant current source 121 and a resistor 122 connected between external power supply voltage Vext and the ground potential. A reference voltage for normal operation Vrefn is output through a common connection node of constant current source 121 and resistor 122.

These reference voltage generation circuits 10a and 10b will later be described more in detail in conjunction with FIGS. 14 and 15. The output voltage Vrefb of reference voltage generation circuit for burn-in test 10a has a positive temperature characteristic (or a positive temperature coefficient). More specifically, the voltage level of the reference voltage Vrefb increases as a function of increase of ambient temperature. Meanwhile, the output voltage Vrefn of reference voltage generation circuit for usual operation 10b is not affected by changes in the ambient temperature.

Voltage selection circuit 90 includes PMOS transistors 902, 903, and 907, and NMOS transistors 904, 905, and 906. Transistors 902 to 906 constitute a differential amplifier, and the output voltage of the differential amplifier is applied to the gate electrode of driver transistor 907.

Transistors 904 and 906 have their gate electrodes connected to receive the reference voltage Vrefb. Meanwhile, transistor 905 has its gate electrode connected to receive the reference voltage Vrefn. A control voltage is applied to the gate of transistor 907 through a common connection node of transistors 902 and 904. This controls the conduction state of transistor 907, and the higher one of the applied reference voltages Vrefb and Vrefn is output as the output reference voltage Vref. Stated differently, voltage selection circuit 90 compares the two applied reference voltages Vrefb and Vrefn, and selectively outputs the voltage having the higher voltage level as the output reference voltage Vref. The output reference voltage Vref is applied to differential amplification circuit 20.

Differential amplification circuit 20 includes PMOS transistors 201, 202, and 203, and NMOS transistors 203, 205, and 206. Transistor 202 to 206 constitute a differential amplifier. Transistor 204 has its gate electrode connected to receive the output reference voltage Vref from voltage selection circuit 90. Transistor 205 has its gate electrode connected to receive an internal voltage (in other words internal power supply voltage) Vint. Transistors 201 and 206 have their gate electrodes connected to receive a control signal VDCE. A control voltage Vc is applied to the gate electrode of a PMOS transistor 301 constituting a driver circuit 30 through a common connection node N3 of transistors 202 and 204.

When a control signal VDCE of "H" level is applied, transistor 206 is turned on, and transistor 201 is turned off.

Accordingly, the differential amplifier constituted by transistors 202 to 206 is activated, the conduction of driving transistor 301 is controlled by the output control voltage Vc from the differential amplifier. Thus, the level of the internal voltage (in other words internal power supply voltage) Vint is controlled to be the same as the reference voltage Vref applied from voltage selection circuit 90.

Meanwhile, when the control signal VDCE of "L" level is applied, transistor 201 is turned on, and transistor 206 is turned off. Accordingly, the differential amplifier constituted by transistors 202 to 206 attains a non-activation state, and the control voltage Vc of "H" level is applied to the gate electrode of transistor 301. Since transistor 301 is turned off in response to the applied control voltage Vc, the internal voltage Vint is not output.

FIG. 13 is a representation showing voltage characteristic for use in illustration of the relation between the external power supply voltage Vext and the reference voltage Vref selected by voltage selection circuit 90 shown in FIG. 12. Referring to FIG. 13, the abscissa represents the external power supply voltage Vext (V), while the ordinate represents the output reference voltage Vref (V). As in the case of the voltage characteristic representation in FIG. 11, straight line 251 indicates Vref=Vext, straight line 252 indicates Vref=3.3 V (constant), and straight line 253 indicates Vref=Vext−2.7 V.

Reference voltage generation circuit for burn-in test 10a outputs a reference voltage Vrefb (=Vext−$I_B \cdot R_B$) changing depending upon the external power supply voltage Vext. Herein, $I_B$ represents the output current of constant current source 112, and $R_B$ the resistance value of resistor 111

Meanwhile, reference voltage generation circuit for usual operation 10b outputs a constant reference voltage Vrefn (=$I_N \cdot R_N$) which does not depend on the external power supply voltage Vext. Herein, $I_N$ represents the output current of constant current source 121, while $R_N$ represents the resistance value of resistor 122.

When the external power supply voltage Vext<3.3 V, the output reference voltage Vref represented by Vref=Vext is applied to differential amplification circuit 20. Accordingly, in this range, the internal voltage Vint having the relation represented by Vint=Vext is supplied as the internal power supply voltage to an internal circuit which is not shown.

As has been already pointed out, reference voltage generation circuit for burn-in test 10a shown in FIG. 12 has a positive temperature characteristic. More specifically, the reference voltage for burn-in test Vrefb has a positive temperature coefficient, and therefore its voltage level increases in response to the increase of ambient temperature. Stated differently, the voltage level of reference voltage Vrefb decreases in response to the decrease of ambient temperature.

As in the case of the example shown in FIG. 11, it is assumed that a condition for burn-in test (i.e. point P10 shown in FIG. 11 and 13) is required in a semiconductor device to which the internal down converter shown in FIG. 12 is applied. More specifically, 8 V for Vext and 5.3 V for Vint are necessary for executing a burn-in test in this example under an ambient temperature of 125° C.

In order to satisfy this condition, reference voltage generation circuit for burn-in test 10a shown in FIG. 12 has the characteristic shown in FIG. 13. More specifically, voltage selection circuit 90 can output the reference voltage Vref of 5.3 V when the power supply voltage Vext is 8 V at the ambient temperature of 125° C. In other words, the internal voltage (Vint) which satisfies the condition for burn-in test (i.e. point P10 in FIG. 13) can be supplied to the internal circuit which is not shown. Furthermore, when an external power supply voltage Vext in excess of 6.0 V is supplied at the ambient temperature of 125° C., a reference voltage Vref satisfying the relation Vref=Vext−2.7 V is supplied to differential amplification circuit 20.

Meanwhile, if the ambient temperature decreases, in other words in the range of the ambient temperature from 0° C. to 7° C. for normal operation, the characteristic of the output reference voltage Vref is shifted to straight line 254 shown in FIG. 13. More specifically, reference voltage generation circuit for burn-in test 10a shown in FIG. 12 has a positive temperature characteristic, and therefore the output reference voltage Vref decreases along straight line 254 as a function of the decrease of the ambient temperature. This brings about the following advantage in normal operation.

Figure 10:
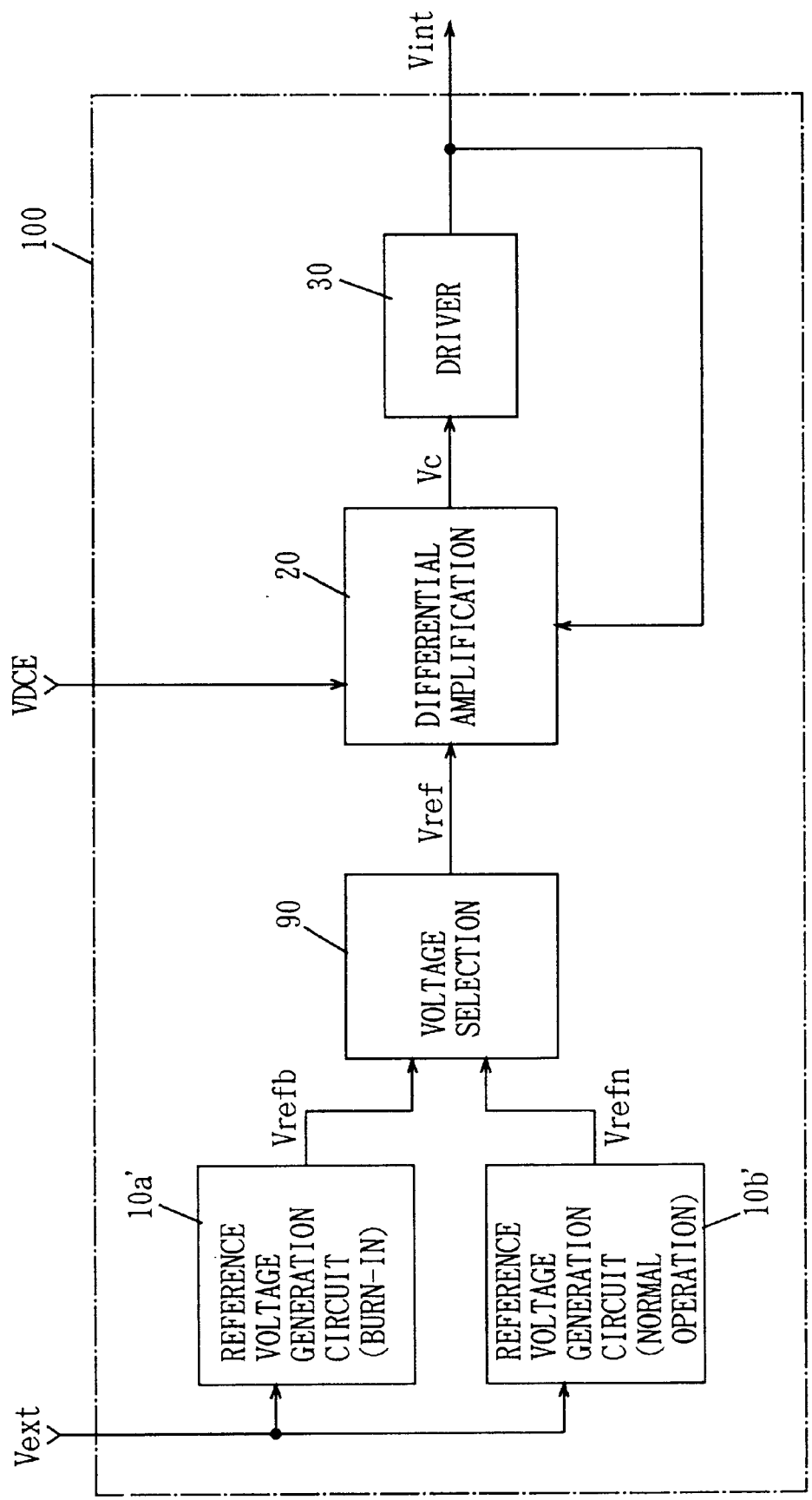
FIG. 10 is a block diagram showing an internal down converter taking into account a burn-in test.

As described above, voltage selection circuit 90 selectively outputs the higher one of the applied reference voltages Vrefb and Vrefn as the output reference voltage Vref. At the ambient temperature for normal operation (RT), since the reference voltage Vrefb is decreased as illustrated in FIG. 13, the range of the external power supply voltage Vext permitting the output reference voltage Vref of 3.3 V (constant) to be output from voltage selection circuit 90 can be expanded. More specifically, internal down converter 100 shown in FIG. 10 can output the internal voltage Vint of 3.3 V only when 3.3 V≦Vext≦6.0 V as illustrated in FIG. 11, but the internal down converter shown in FIG. 12 can output the internal voltage Vint of 3.3 V (constant) when 3.3 V≦Vext≦6.0+α V as illustrated in FIG. 13. Stated differently, by the use of reference voltage generation circuit for bur-in test 10a having the positive temperature characteristic, the internal down converter can operate in an extended range of the external power supply voltage Vext at the ambient temperature for normal operation (RT) taking into account execution of burn-in test.

Figure 14:
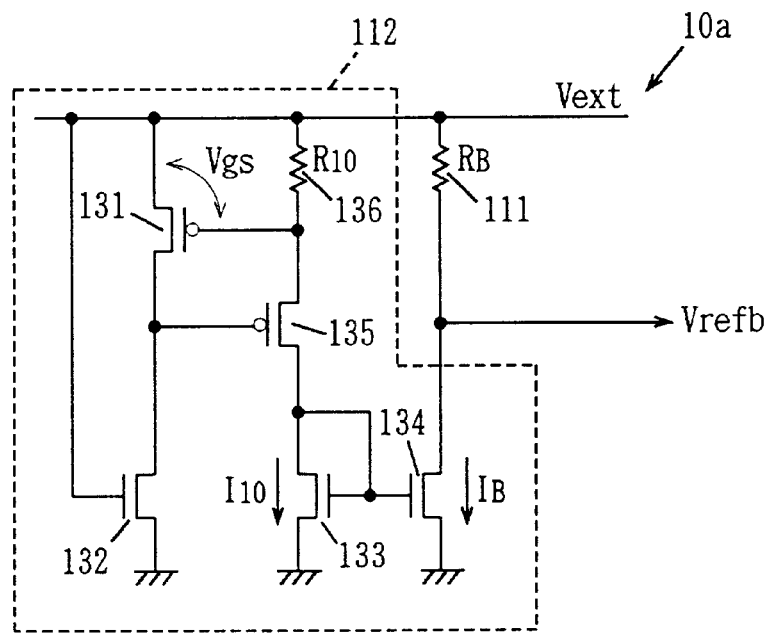
FIG. 14 is a circuit diagram showing a reference voltage generation circuit for burn-in test 10a shown in FIG. 12.

FIG. 14 is a circuit diagram showing reference voltage generation circuit for burn-in test 10a shown in FIG. 12. Referring to FIG. 14, a constant current source circuit 112 includes PMOS transistor 131 and 135, NMOS transistors 132, 133, and 134, and a resistor 136.

Transistor 132 has a narrow gate width and therefore has a row mutual conductance. Accordingly, transistor 131 is operated in a threshold region. In other words, transistor 131 is brought to a substantial non-conduction state. Accordingly, the gate-source voltage Vgs of transistor 131 is substantially equal to Vtp (the threshold voltage of PMOS transistor). As a result, the following relation is established.

$$I10 = Vgs/R10 \approx Vtp/R10 \qquad (6)$$

where I10 represents current flowing across transistor 133, while R10 is the resistance value of resistor 136.

Transistors 133 and 134 constitute a current mirror circuit. Transistors 133 and 134 are the same in transistor size in this example (in other words have the same mutual conductance), and therefore $I_B$=I10 holds. As a result, the following relation is established.

$$I_B = Vtp/R10 \qquad (7)$$

Therefore, the output voltage Vrefb of reference voltage generation circuit for burn-in test 10a is given by the following equations:

$$Vrefb = Vext - I_B \cdot R_B \qquad (8)$$

-continued $$= Vext - Vtp \cdot R_B / R10 \qquad (9)$$

Accordingly, as can be seen from equation (8), the condition of (i) giving a negative temperature characteristic to $I_B$ and/or (ii) giving a negative temperature characteristic to $R_B$ will be necessary in order to give a positive temperature characteristic to the reference voltage Vrefb.

Various circuit structures can be employed for providing reference voltage generation circuit for burn-in test 10a shown in FIG. 14 with the above-described condition (i) and/or (ii). Generally, the threshold voltage Vtp of a PMOS transistor has a negative temperature characteristic. When the ambient temperature increases from 25° C. to 125° C., for example, the threshold voltage Vtp is decreased by about 0.1 V to 0.2 V. More specifically, as can be understood from equation (7), even if the resistance value R10 of resistor 136 does not have a temperature characteristic, $I_B$ can have a negative temperature characteristic. However, a material having a positive temperature characteristic is preferably used for resistor 136 to set a larger temperature coefficient for $I_B$.

As a material having a positive temperature characteristic, for example polysilicon is utilized. The temperature coefficient of polysilicon changes depending upon the structure and the concentration of impurity contained in polysilicon. Generally, polysilicon before doped with impurity has a negative temperature characteristic like semiconductor, the temperature coefficient increases with the increase of the impurity concentration, and therefore, the temperature coefficient changes from a negative value to a positive value.

Figure 17:
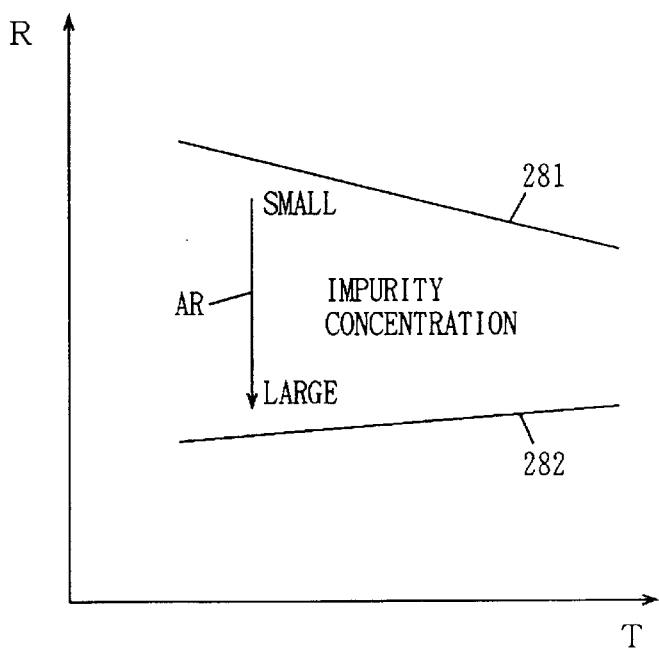
FIG. 17 is a representation showing the relation between the resistance of polysilicon and ambient temperature.

This is illustrated in the characteristic representation of FIG. 17. Referring to FIG. 17, the abscissa represents change in the ambient temperature T, while the ordinate represents change in the resistance R of polysilicon. As the impurity concentration increases as indicated by allow AR, the resistance of polysilicon gradually changes from curve 281 to curve 282. The impurity concentration of polysilicon is selected to be an optimal value for giving a desired temperature coefficient.

In addition, it is pointed out that a diffusion resistor and a channel resistor for a transistor can be utilized as another resistance material having a positive temperature characteristic.

Furthermore, as can be understood from equation (9), a resistance material is selected so that the value of $Vtp \cdot R_B / R10$ has a negative temperature characteristic, in order to give a positive temperature characteristic to the reference voltage Vrefb. More specifically, if resistors 111 and 136 both have a positive temperature characteristic, a resistance material having the relation given by the following inequality is utilized for resistances 111 and 136 shown in FIG. 14.

temperature coefficient of $R_V$<temperature coefficient of R10 (10)

The use of a resistance material satisfying the above condition in reference voltage generation circuit for burn-in test 10a shown in FIG. 14 permits the reference voltage generation circuit 10a to generate the reference voltage Vrefb having a positive temperature characteristic.

Figure 15:
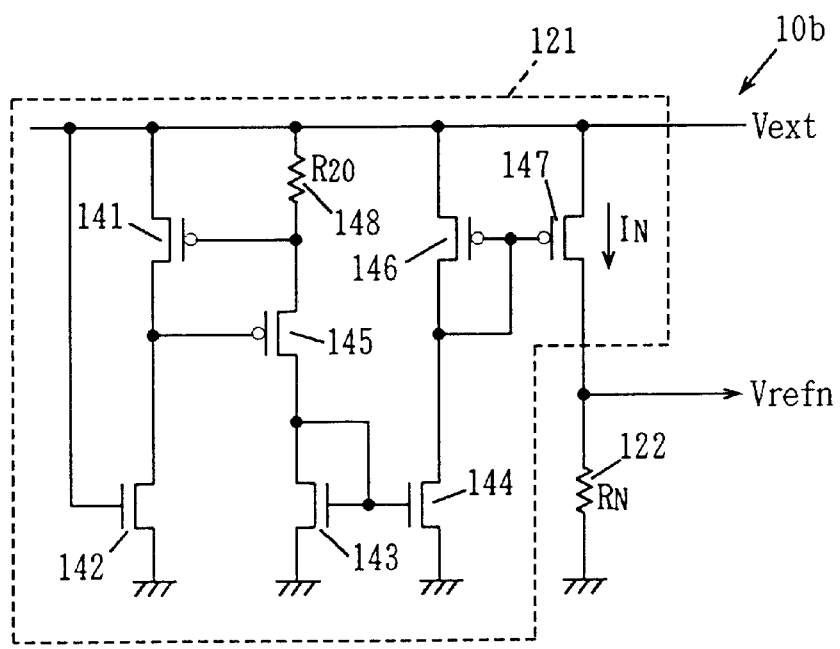
FIG. 15 is a circuit diagram showing a reference voltage generation circuit for normal operation 10b shown in FIG. 12.

FIG. 15 is a circuit diagram showing reference voltage generation circuit for normal operation 10b shown in FIG. 12. Referring to FIG. 15, constant current source circuit 121 includes PMOS transistors 141, 145, 146, and 147, NMOS transistors 142, 143, and 144, and a resistor 148. Transistors 143 and 144 constitute a current mirror circuit, and transistors 146 and 147 constitute another current mirror circuit.

The basic operation of constant current source circuit 121 is the same as that of circuit 112 shown in FIG. 14. However, in reference voltage generation circuit for normal operation 10b, circuit elements having no (or almost negligible) temperature characteristic is utilized. As a result, reference voltage generation circuit 10b shown in FIG. 15 can output a constant reference voltage Vrefn independent of changes in the ambient temperature.

Figure 16:
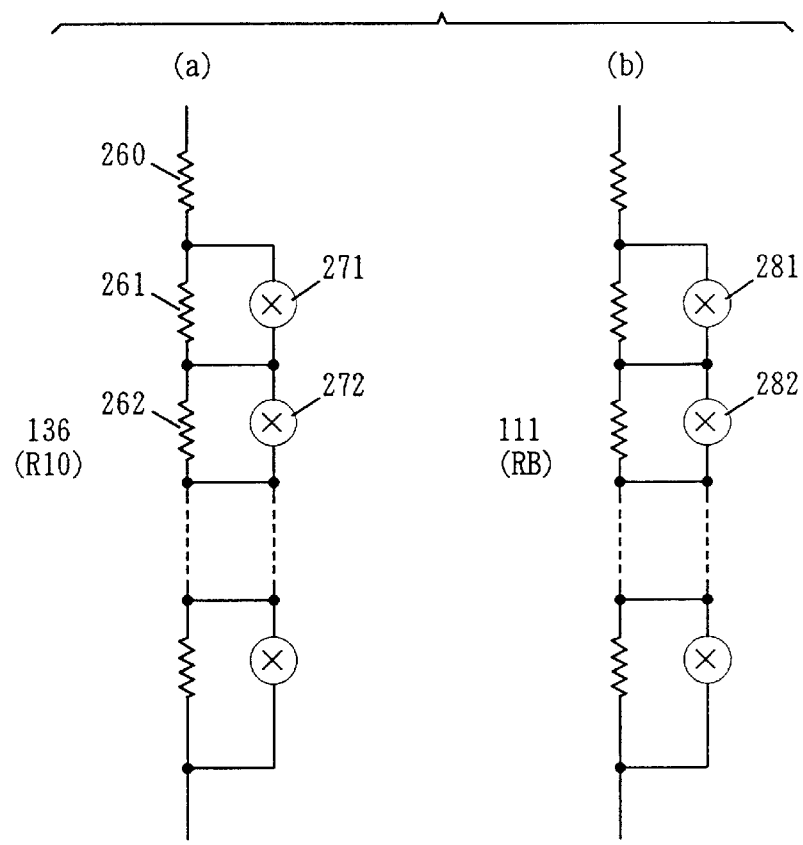
FIG. 16 is a circuit diagram showing an adjustable resistor circuit used for resistors 111 and 136 shown in FIG. 14.

FIG. 16 is a circuit diagram showing an adjustable resistor circuit used for resistors 111 and 136 shown in FIG. 14. FIG. 16 at (a) shows an adjustable resistor circuit for resistor 136. Resistor circuit 136 includes resistors 260, 261, . . . connected in series, and fuse links 271, 272, . . . connected correspondingly across resistors 261, 262, . . . .

Voltage conditions for burn-in test can be shifted due to some change in a semiconductor manufacturing process. In such a case, by selectively blowing fuse links 271, 272, . . . with laser beam, the resistance value R10 of resistor circuit 136 can be adjusted to a preferable value. Similarly, resistor circuit 111 shown in FIG. 16 at (b) is used for resistor 111 shown in FIG. 14. Accordingly, the resistance value $R_B$ of resistor circuit 111 can also be adjusted to a desired value.

As described above, the internal down converter according to the fifth embodiment includes reference voltage generation circuit for burn-in test 10a having a positive temperature characteristic, and therefore the internal voltage Vint having the temperature characteristic shown in FIG. 13 is supplied as the internal power supply voltage. Accordingly, in a wider range of the external power supply voltage Vext, in other words in the range $3.3 \text{ V} \leq Vext \leq 6.0 + \alpha \text{ V}$, the internal voltage Vint of 3.3 V (constant) can be supplied as the internal power supply voltage to the internal circuit (not shown) under the ambient temperature for normal operation. Stated differently, an internal down converter capable of operating in a wider range of external power supply voltage, taking into account execution of burn-in test is provided.

(6) Sixth Embodiment

Figure 18:
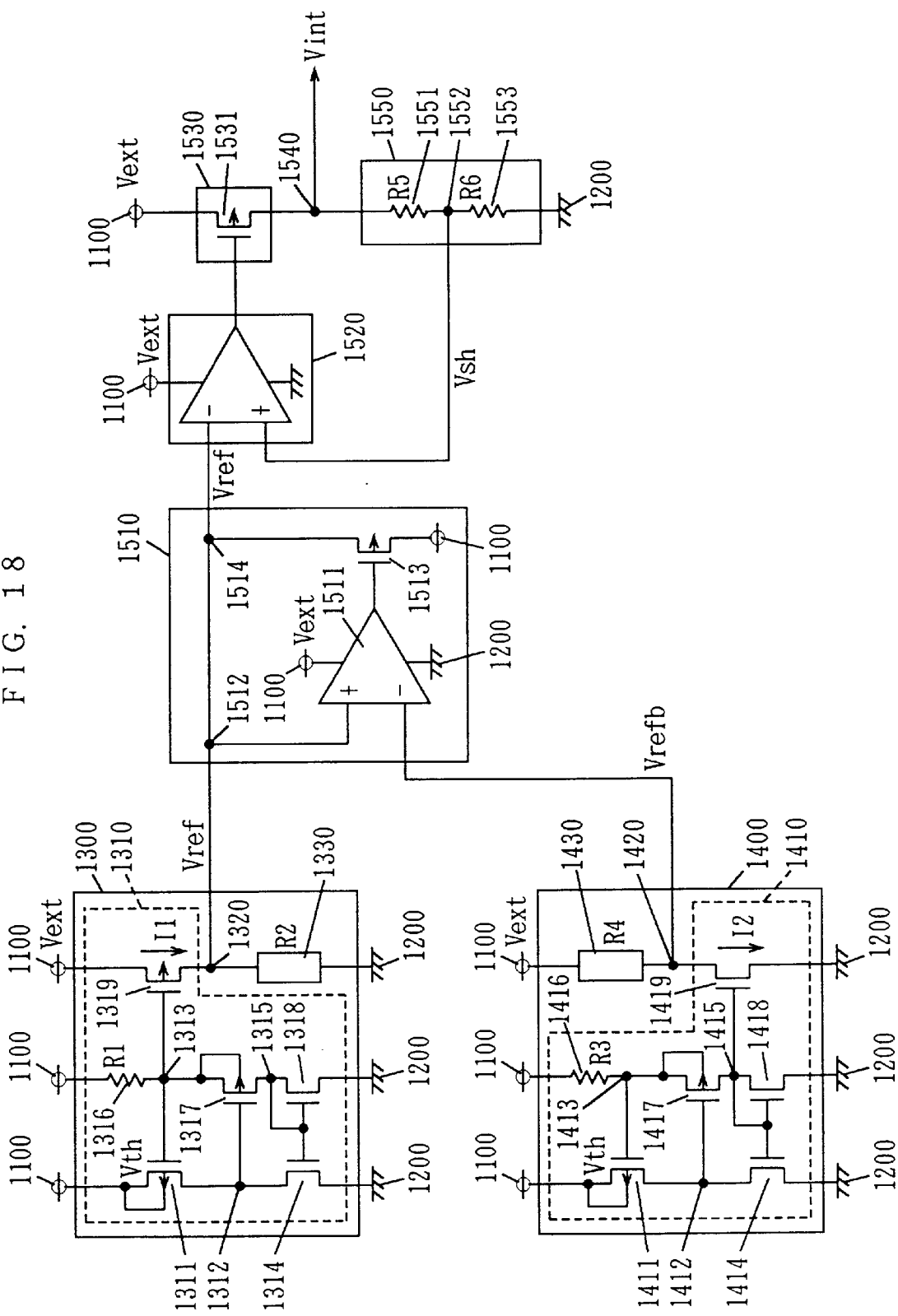
FIG. 18 is a circuit diagram showing an internal down converter according to a sixth embodiment of the invention.

FIG. 18 is a circuit diagram showing an internal down converter according to a sixth embodiment of the invention. The internal down converter shown in FIG. 18 is formed in a semiconductor substrate CH as internal down converters 1a, 1b, 1c, and 1d shown in FIG. 1. Referring to FIG. 18, the internal down converter includes a reference voltage generation circuit for normal operation 1300, a reference voltage generation circuit for burn-in test 1400, a voltage selection circuit 1510, a differential amplification circuit 1520, a driver circuit 1530, and a level shifter circuit 1550.

Reference voltage generation circuit for normal operation 1300 includes a constant current source circuit 1310 and a resistor 1330 connected between an external power supply voltage Vext and the ground potential. A reference voltage Vrefn for normal operation is output through a common connection node 1320 of constant current source circuit 1310 and resistor 1330.

Reference voltage generation circuit for burn-in test 1400 includes a resistor 1430 and a constant current source circuit 1410 connected between the external power supply voltage Vext and the ground potential. A reference voltage for burn-in test Vrefb is output through a common connection node 1420 of resistor 1430 and constant current source circuit 1410.

Also in the sixth embodiment as in the case of the fifth embodiment, the output voltage Vrefb of reference voltage generation circuit for burn-in test 1400 has a positive temperature characteristic (or positive temperature coefficient). More specifically, the voltage level of reference voltage Vrefb increases as a function of the increase of the ambient temperature. Meanwhile, the output voltage Vrefn of reference voltage generation circuit for normal operation 1300 is not affected by changes in the ambient temperature.

Constant current source circuit 1310 includes PMOS transistors 1311, 1317, and 1319, NMOS transistors 1314 and 1318, and a resistor 1316. Transistor 1311 has a threshold voltage Vth (absolute value). Reference voltage 1316 has a resistance value R11. Resistor 1316 is formed of a wiring resistor such as polysilicon doped with boron or phosphorus. Transistors 1314 and 1318 constitute a current mirror circuit.

The output current I1 of constant current source circuit 1310 flows across resistor 1330 having a resistance value R12. The channel resistor of an MOS transistor is used for resistor 1330 in order to reduce the occupied area on the semiconductor substrate.

Constant current source circuit 1410 includes PMOS transistors 1411 and 1417, NMOS transistors 1414, 1418, and 1419, and a resistor 1419. Transistor 1411 has a threshold voltage Vth (absolute value). Resistor 1416 has a resistance value R13, and formed of a wiring resistor such as polysilicon doped with boron or phosphorus.

The output current I2 of constant current source circuit 1410 flows across resistor 1430 having a resistance value R14. Resistor 1430 is formed of a material the same as resistor 1330.

Voltage selection circuit 1510 includes a differential amplifier 1511 for receiving a reference voltage for normal operation Vrefn and a reference voltage for burn-in test Vrefb, and a PMOS transistor 1513 connected between the reference voltage Vrefn and the external power supply voltage Vext. Transistor 1413 receives an output voltage from differential amplifier 1511 through its gate electrode.

In operation, transistor 1513 is operated in response to the output voltage of differential amplifier 1511, and the higher one of the applied reference voltages Vrefb and Vrefn is output as the reference voltage Vref. Stated differently, voltage selection circuit 1510 compares the two applied reference voltages Vrefb and Vrefn, and selectively outputs the voltage having the higher voltage level. The output reference voltage Vref is applied to a differential amplification circuit 1520.

Differential amplification circuit 1520 receives the reference voltage Vref through an inversion input node, and receives the output voltage Vsh of a level shifter circuit 1550 through a non-inversion input node. The output voltage of differential amplification circuit 1520 is applied to the gate electrode of PMOS transistor 1531 in a driver circuit 1530.

Level shifter circuit 1550 includes a series-connection of resistors 1551 and 1553. Resistor 551 has a resistance value R15, while resistor 1553 has a resistance value R16. The voltage Vsh is output through a common connection node 1552 of these resistors. An internal voltage Vint is output through a common connection node 1540 of driver circuit 1530 and the level shifter circuit 1550.

Figure 19:
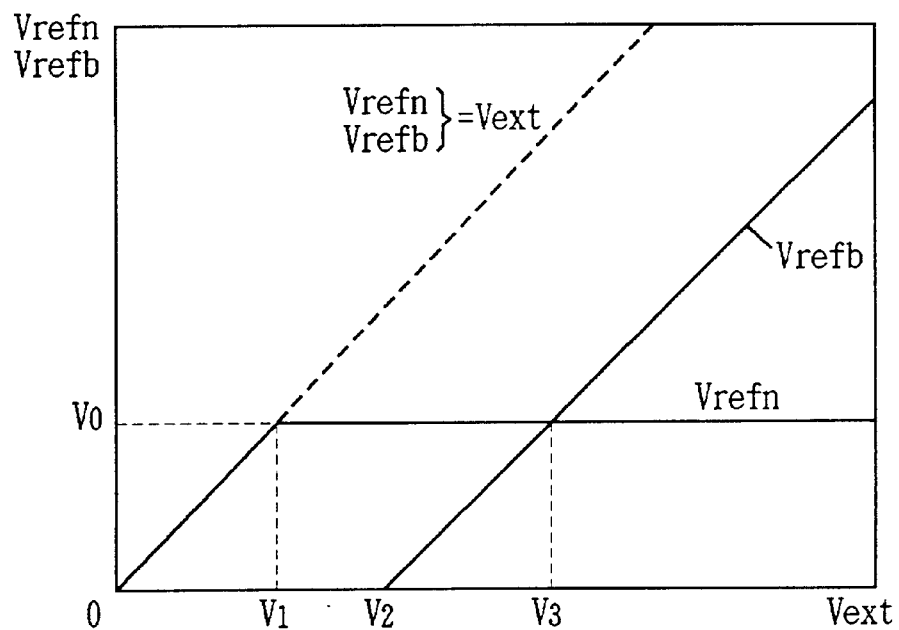
FIG. 19 is a representation showing voltage characteristic for use in illustration of the relation between external power supply voltage Vext and each of reference voltages Vrefn and Vrefb.
Figure 20:
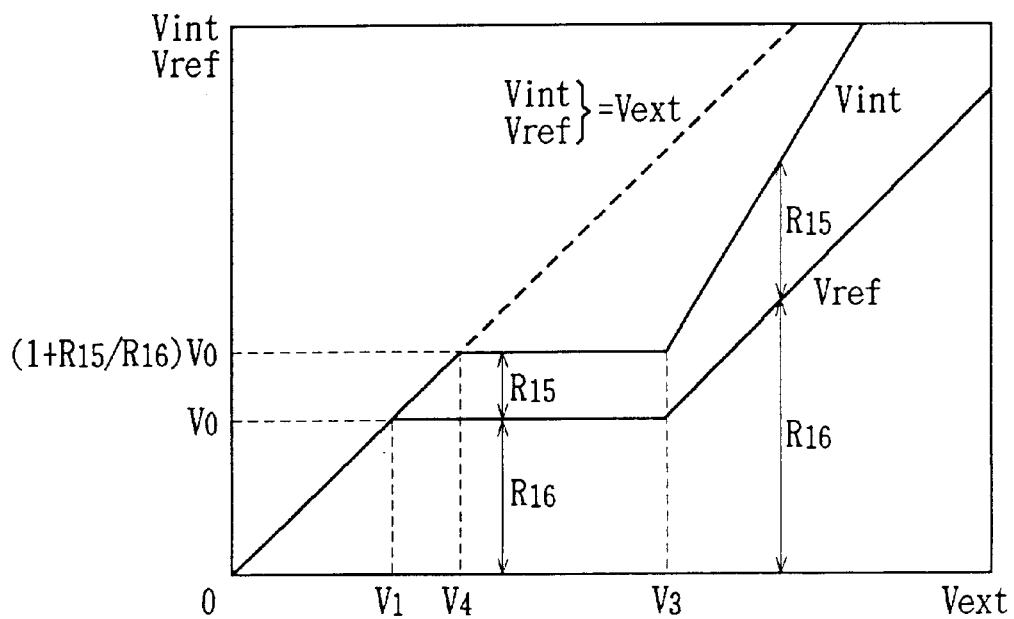
FIG. 20 is a representation showing voltage characteristic for use in illustration of the relation between external power supply voltage Vext and each of voltages Vref and Vint.

FIG. 19 is a representation showing voltage characteristic for use in illustration of the relation between the external power supply voltage Vext and each of reference voltages Vrefn and Vrefb. In FIG. 19, the abscissa represents the external power supply voltage Vext, while the ordinate represents the reference voltage for normal operation Vrefn and reference voltage for burn-in test Vrefb. FIG. 20 is a representation showing voltage characteristic for use in illustration of the relation between the external power supply voltage Vext and each of the voltages Vref and Vint. In FIG. 20, the abscissa represents the external power supply voltage Vext, while the ordinate represents the internal voltage Vint and the selected reference voltage Vref. Referring to FIGS. 19 and 20, the operation of the internal down converter shown in FIG. 18 will be described.

Referring to FIG. 19, if the external power supply voltage Vext changes in the range of 0<Vext<1 (V1 is a first prescribed voltage), the reference voltage Vrefn increases in proportion to the voltage Vext. When $V1 \leq Vext \leq V3$ (V3 is a second prescribed voltage), the reference voltage Vrefn is constant and a prescribed voltage Vo.

Accordingly, when $V1 \leq Vext \leq V3$, a current I1 flowing from transistor 1319 toward an output node 1320 is approximately given by the following equation:

$$I1 = Vth/R11 \tag{11}$$

Therefore, the prescribed voltage Vo is given by the following equation:

$$Vo = I1 \cdot R12 = Vth \cdot R12/R11 \tag{12}$$

Meanwhile, the reference voltage for burn-in test Vrefb increases in proportion to the external power supply voltage Vext for V2<Vext. When V3<Vext, the reference voltage Vrefb exceeds the voltage level of the reference voltage Vrefn.

A current I2 flowing from an output node 1420 to the ground potential is approximately given by the following equation:

$$I2 = Vth/R13 \tag{13}$$

Therefore, the reference voltage Vrefb is given by the following equation:

$$\begin{aligned} Vrefb &= Vext - I2 \cdot R14 \\ &= Vext - Vth \cdot R14/R13 \end{aligned} \tag{14}$$

Accordingly, voltage selection circuit 1510 outputs the output voltage Vref illustrated in FIG. 20. More specifically, differential amplifier 1511 applies the output voltage of the external power supply voltage Vext to the gate electrode of transistor 1513 when Vrefb<Vrefn. Therefore, in this range, transistor 1513 is brought to a non-conduction state, and the reference voltage Vrefn is selected as the output voltage Vref.

When Vrefb>Vrefn, differential amplifier 1511 applies the output voltage of the ground potential level to the gate electrode of transistor 1513. Accordingly, in this range, transistor 1513 is brought to a conduction state, and the level of the output voltage Vref is increased from Vo.

Differential amplifier 1511 receives the output voltage Vref through the non-inversion input node. Therefore, since differential amplifier 1511 applies the voltage of the level of Vext to the gate electrode of transistor 1513 in the range of Vrefn>Vrefb, transistor 1513 attains a non-conduction state. As a result, the voltage Vref having the voltage level the same as Vrefb is output from voltage selection circuit 1510, and the output voltage Vref as indicated by line Vref in FIG. 20 is output from voltage selection circuit 1510.

Differential amplification circuit 1520 receives the selected reference voltage Vref through the inversion input node. Meanwhile, differential amplification circuit 1520 receives the output voltage Vsh from level shifter circuit 1550 through the non-inversion input node. Accordingly, differential amplification circuit 1520 outputs the voltage of the ground potential level to the gate electrode of transistor 1531 when Vsh<Vref (i.e. Vext<V4). Accordingly, transistor 1531 attains a conduction state in this range, and the internal voltage Vint is in proportion to the external power supply voltage Vext in this range.

When Vsh>Vref, differential amplification circuit 1520 applies the voltage of the Vext level to the gate electrode of transistor 1513, transistor 1531 attains a non conduction state. As a result, in this range, the relation Vsh=Vref is established, and the internal voltage Vint given by the following equation is output (see FIG. 20).

$$Vint = (1 + R15/R16) \cdot Vref \tag{15}$$

As can be understood from equation (15), the ratio of the voltage difference between voltage Vint and Vref to the voltage Vref is R15:R16.

Figure 21:
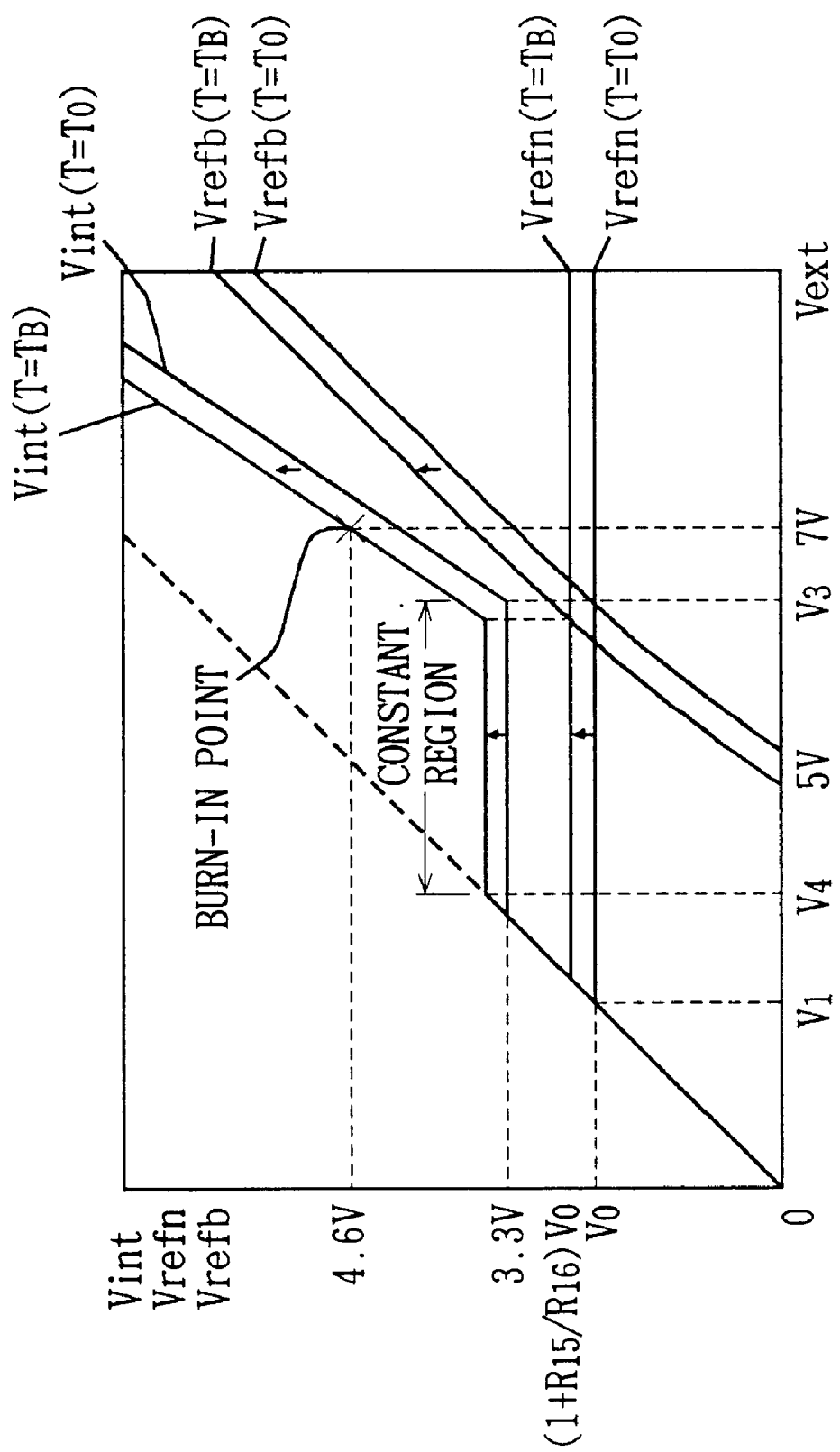
FIG. 21 is a representation showing voltage characteristic for use in illustration of the relation between external reference voltage Vext and internal voltage Vint.

FIG. 21 is a representation showing voltage characteristic for use in illustration of the relation between the external power supply voltage Vext and the internal voltage Vint. Referring to FIG. 21, the temperature dependence of the output voltage Vint of the internal down converter will be described.

In FIG. 21, the abscissa represents the external power supply voltage Vext, while the ordinate represents the internal voltage Vint, the reference voltages Vrefn and Vrefb.

Referring back to FIG. 18, resistor 1316 having the resistance value R11 is formed of a wiring material such as polysilicon. The channel resistor of an MOS transistor is utilized for resistor 1330 having the resistance value R12. A wiring material such as polysilicon is used for resistor 1416 having the resistance value R13. A material the same as resistor 1416 is used for resistor 1430 having the resistance value 14.

Generally, the threshold voltage Vth of an MOS transistor has a negative temperature coefficient. Meanwhile, the resistance value of polysilicon generally has a positive temperature coefficient. Furthermore, the channel resistor of an MOS transistor has a temperature coefficient considerably larger than the temperature coefficient of the above-described threshold voltage of the transistor and the temperature coefficient of polysilicon.

It is assumed that the temperature coefficients of resistors 1316 (R11), 1330 (R12), 1416 (R13), and 1430 (R14) are $\alpha 1$, $\alpha 2$, $\alpha 3$, and $\alpha 4$, respectively. Furthermore, it is assumed that the temperature coefficient of the threshold voltage Vth of the transistor is $\alpha 5$, and the temperature coefficient of the output current I2 of constant current source circuit 1410 is $\alpha 6$. Therefore, the following relations are established:

$$R11 = R11ct \cdot (1 + \alpha 1 \cdot \Delta T) \tag{16}$$

$$R12 = R12ct \cdot (1 + \alpha 2 \cdot \Delta T) \tag{17}$$

$$R13 = R13ct \cdot (1 + \alpha 3 \cdot \Delta T) \tag{18}$$

$$R14 = R14ct \cdot (1 + \alpha 4 \cdot \Delta T) \tag{19}$$

$$Vth = Vthct \cdot (1 + \alpha 5 \cdot \Delta T) \tag{20}$$

$$I2 = I2ct \cdot (1 + \alpha 6 \cdot \Delta T) \tag{21}$$

In equations (16) to (21), affix ct indicates that each value is independent of change in the ambient temperature, and $\Delta T$ represents change (difference) in the ambient temperature.

If the reference voltage for normal operation Vrefn=Vo holds, the following relation is obtained from equations (12), (16), (17), and (20).

$$Vrefn = Vo = Vth \cdot R12 / R11 \tag{22}$$

$$= (Vthct \cdot R12ct / R11ct) \cdot (1 + \alpha 5 \cdot \Delta T) \cdot$$

$$(1 + \alpha 2 \cdot \Delta T) / (1 + \alpha 1 \cdot \Delta T)$$

In equation (12), Vthch·R12ct/R11ct is not affected by changes in the ambient temperature, $\alpha 5$ is a negative value, $\alpha 1$ is a positive value, $\alpha 2 >> \alpha 1$, $|\alpha 5|$, and therefore the voltage Vo is represented by line Vrefn (T=To) and line Vrefn (T=$T_B$) in FIG. 21. Stated differently, the voltage Vo has a positive temperature coefficient.

Meanwhile, the output current I2 of constant current source circuit 1410 is given by the following equation from equations (13), (18), and (20).

$$I2 = Vth/R13 = (Vthct/R13ct) \cdot (1 + \alpha 5 \cdot \Delta T)/(1 + \alpha 3 \cdot \Delta T) \tag{23}$$

In equation (23), Vthct/R13ct is not affected by changes in the ambient temperature, $\alpha 5$ is a negative value, $\alpha 3$ is a positive value, and therefore the current I2 has a negative temperature coefficient.

Meanwhile, the reference voltage for burn-in test Vrefb is given by the following equation from equations (14), (18), (19), and (20).

$$Vrefb = Vext - Vth \cdot R14 / R13 \tag{24}$$

$$= Vext - (Vthct \cdot R14ct / R13ct) \cdot (1 + \alpha 5 \cdot \Delta T) \cdot$$

$$(1 + \alpha 4 \cdot \Delta T) / (1 + \alpha 3 \cdot \Delta T)$$

In equation (14), Vext and Vthct·R14ct/R13ct are not affected by changes in the ambient temperature, $\alpha 5$ is a negative value, $\alpha 4 = \alpha 3$, and therefore the reference voltage Vrefb has a positive temperature coefficient as indicated by line Vrefb (T=To) and line Vrefb (T=$T_B$) in FIG. 21.

Therefore, the output voltage Vref of voltage selection circuit 1510 has a positive temperature coefficient both when Vrefb<Vrefn and Vrefb>Vrefn.

Since resistors 1511 and 1513 provided in level shift circuit 1550 are formed of the same material, the resistance values R15 and R16 have the same temperature coefficient. Accordingly, the internal voltage Vint has the same temperature coefficient as the reference voltage Vref, and therefore has a positive temperature characteristic as indicated by line Vint (T=To) and line Vint (T=$T_B$) in FIG. 21.

A burn-in test about a semiconductor integrated circuit device including the internal down converter as illustrated in FIG. 18 will be conducted as follows. An external power supply voltage Vext giving the same ratio as that of an external power supply voltage Vext and an internal voltage Vint in normal operation at an ambient temperature of 25° C. (T=To=25° C.) is selected as a burn-in point. Of course, the external voltage Vint is selected in the range not exceeding the breakdown voltage of the semiconductor elements in the circuit. More specifically, assuming that the semiconductor integrated circuit device is operated at the external power supply voltage Vext of 5 V and the internal voltage Vint of 3.3 in normal operation and the breakdown voltage is a little more than 7 V, Vext=7 V and Vint=4.6 V are selected for the burn-in point.

As in the foregoing, the internal voltage Vint has a positive temperature characteristic. The resistance value R4 of resistor 1430 in reference voltage generation circuit 1400 is therefore set to a large value so that the internal voltage Vint is located below the burn-in point at a normal ambient temperature To as indicated by line Vint (T=To) in FIG. 21, and above the burn-in point at an ambient temperature $T_B$ for burn-in test as indicated by line Vint (T=$T_B$).

In the internal down converter as illustrated in FIG. 18, when V4≦Vext≦V3, the internal voltage Vint is equal to (1+R15/R16)·Vo. When Vext<V3, the voltage Vint is equal to (1+R15/R16)·Vrefb. When Vext>V3, since the reference voltage Vref is selected so that the value (1+R15/R16)·Vrefb is smaller than the burn-in point at the normal ambient temperature To, the external voltage Vext (=V3) increases when the reference voltage Vref exceeds the voltage Vo. More specifically, since the internal voltage Vint is equal to (1+R15/R16)·Vo, and the range in which it is constant with respect to the external voltage Vext, in other words the range represented by V4≦Vext≦V3 is expanded, and therefore a larger margin is obtained.

It is noted that although resistors 1430 and 1416 are formed of the same material, from equation (24), a resistance material having a temperature coefficient α4 giving the following relation can be utilized.

$$(1+\alpha 5 \cdot \Delta T) \cdot (1+\alpha 4 \cdot \Delta T)/(1+\alpha 3 \cdot \Delta T) < 1 (\Delta T > 0) \quad (25)$$

A wiring material utilizing a different material such as a metal thin film can be used for such a resistance material having the temperature coefficient α4, and in some cases the channel resistor or diffusion resistor of a transistor having a low temperature coefficient can be utilized although it is not generally used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage supply circuit driven by a power supply voltage for supplying an output voltage, comprising:

reference voltage generation means driven by said power supply voltage for generating a reference voltage;

driver means receiving said power supply voltage and supplying said output voltage;

dividing means including first and second resistor means for dividing the output voltage supplied by said driver means and supplying a divided output voltage, said first and second resistor means having resistance values of different temperature coefficients; and comparison means for comparing said divided output voltage supplied by said dividing means and said reference voltage generated by said reference voltage generation means and controlling said driver means based on the difference between said divided output voltage and said reference voltage;

wherein said first resistor means is connected between a node receiving said output voltage and an output node outputting said divided output voltage obtained by dividing, said second resistor means is connected between said output node and a prescribed potential, the resistance value of said first resistor means has a first temperature coefficient, and the resistance value of said second resistor means has a second temperature coefficient smaller than said first temperature coefficient, and said first temperature coefficient is positive and said second temperature coefficient is negative.

2. A down converter for down-converting a power supply voltage and supplying the down-converted voltage to an internal circuit as a power supply voltage, comprising:

reference voltage generation means driven by said power supply voltage for generating a reference voltage;

driver means for supplying said power supply voltage to said internal circuit;

dividing means for dividing the power supply voltage supplied by said driver means and supplying a divided output voltage;

comparison means for comparing said divided output voltage supplied by said dividing means and said reference voltage generated by said reference voltage generation means and controlling said driver means based on the difference between said divided output voltage and said reference voltage; and adjustment means for adjusting the dividing ratio of said dividing means.

3. A down converter as recited in claim 2, wherein said dividing means includes first and second resistor means connected in series, and said adjustment means includes third resistor means and connection means for connecting/disconnecting said third resistor means to/from said first and second resistor means.

4. A down converter as recited in claim 3, wherein said third resistor means includes a plurality of resistor means and said connection means includes a plurality of link means for selectively connecting/disconnecting any of said plurality of resistor means to/from said first and second resistor means.

5. A down converter as recited in claim 4, wherein said plurality of link means each includes a fuse link which can be blown by a laser beam.

6. A down converter as recited in claim 3, wherein said first resistor means includes a transistor connected between a node receiving said power supply voltage and an output node for outputting said output voltage obtained by dividing and having a gate receiving a prescribed activation signal.

7. A down converter as recited in claim 2, wherein said driver means includes a transistor connected between the node receiving said power supply voltage and the node receiving said power supply voltage and having a gate receiving the output signal of said comparison means.

8. A down converter as recited in claim 2, wherein said reference voltage generation means generates voltage which is one of equal to said power supply voltage and a predetermined function less than said power supply voltage, as said reference voltage.

9. A down converter for down-converting a power supply voltage and supplying the down-converted voltage as a power supply voltage to an internal circuit, comprising:

reference voltage generation means driven by said power supply voltage for generating a reference voltage;

driver means for supplying said power supply voltage to said internal circuit;

dividing means for dividing the power supply voltage supplied by said driver means and supplying a prescribed output voltage;

comparison means for comparing said output voltage supplied by said dividing means and said reference voltage generated by said reference voltage generation means and controlling said driver means based on the difference between said output voltage and said reference voltage; and adjustment means for adjusting the dividing ratio of said dividing means, said driver means including a transistor connected between a node receiving said power supply voltage and an output node receiving said power supply voltage and having a gate receiving the output signal of said comparison means, and said driver means supplies as said power supply voltage a voltage lower than said external power supply voltage and higher than the voltage produced by subtracting the threshold voltage of said transistor and a prescribed margin from said external power supply voltage.

10. An internal down converter as recited in claim 9, wherein said transistor includes a P channel field effect transistor.

11. A down converter as recited in claim 9, wherein said reference voltage generation means generates voltage which is one of equal to said power supply voltage and a predetermined function less than power supply voltage, as said reference voltage.

12. A voltage supply circuit driven by an external power supply voltage for supplying an output voltage, comprising:

reference voltage generation means driven by said power supply voltage for generating a reference voltage;

driver means receiving said power supply voltage and supplying said output voltage;

dividing means including first and second resistor means for dividing the output voltage supplied by said driver means by said first and second resistor means and supplying a divided output voltage said first and second resistor means having resistance values of different temperature coefficients;

comparison means for comparing said divided output voltage supplied by said dividing means and said reference voltage generated by said reference voltage generation means and controlling said driver means based on the difference between said divided output voltage and said reference voltage; and adjustment means for adjusting at least one of the resistance values of said first and second resistor means of said dividing means.

13. A voltage supply circuit as recited in claim 12, wherein said first resistor means is connected between a node receiving said output voltage and an output node outputting said divided output voltage obtained by dividing, said second resistor means is connected between said output node and a prescribed potential, the resistance value of said first resistor means has a first temperature coefficient, and the resistance value of said second resistor means has a second temperature coefficient smaller than said first temperature coefficient.

14. A voltage supply circuit as recited in claim 13, wherein said first temperature coefficient is positive, and said second temperature coefficient is negative.

15. A voltage supply circuit as recited in claim 13 wherein said adjustment means includes changing means for changing the resistance values of said first and second resistor means.

16. A voltage supply circuit as recited in claim 15, wherein said first resistor means includes a first resistance element and a plurality of first resistance means connected between said node receiving said output voltage and said output node, said second resistor means includes a second resistance element and a plurality of second resistance means connected between said output node and said prescribed potential, said changing means includes first separation means for connecting/disconnecting predetermined ones of said plurality of first resistance means between said node receiving said output voltage and said output node and second separation means for connecting/disconnecting predetermined ones of said plurality of second resistance means between said output node and said prescribed potential.

17. A voltage supply circuit as recited in claim 16, wherein said separation means includes a plurality of fuse links which can be blown by a laser beam.

18. A voltage supply circuit as recited in claim 17, wherein said first resistor means includes a transistor having a gate receiving a prescribed activation signal.

19. A voltage supply circuit as recited in claim 12, wherein said driver means includes a transistor connected between a node receiving said power supply voltage and a node receiving said output voltage and having a gate receiving the output signal of said comparison means.

20. A voltage supply circuit as recited in claim 12, wherein said driver means supplies said output voltage to an internal circuit as supply voltage for said internal circuit.

21. A voltage supply circuit as recited in claim 12, wherein said driver means supplies said output voltage to an internal circuit.

22. A voltage supply circuit as recited in claim 12, wherein said driver means supplies said output voltage to a buffer means.

23. A semiconductor device formed on a semiconductor chip, comprising:

voltage supply means driven by a power supply voltage for supplying an output voltage; and storage means receiving said output voltage and storing data, said voltage supply means including reference voltage generation means driven by said power supply voltage for generating a reference voltage, driver means receiving said power supply voltage and supplying said output voltage, dividing means including first and second resistor means for dividing the output voltage supplied by said driver means by said first and second resistor means and supplying a divided output voltage said first and second resistor means having resistance values of different temperature coefficients, and comparison means for comparing said divided output voltage supplied by said dividing means and said reference voltage generated by said reference voltage generation means and controlling said driver means based on the difference between said divided output voltage and said reference voltage, and further comprising adjustment means for adjusting at least one of the resistance values of said first and second resistor means of said dividing means.

24. A semiconductor device as recited in claim 23, wherein said first resistor means includes first resistor circuit means including a plurality of resistance means, said second resistor means includes second resistor circuit means including a plurality of resistance means, and said adjustment means includes separation means for separating any of the resistance means of said first or second resistor circuit means from the remaining resistance means.

25. A semiconductor device formed on a semiconductor chip, comprising:

down converting means for down-converting a power supply voltage and supplying the down-converted voltage as a power supply voltage, and storage means driven by said power supply voltage for storing data, said down converting means including, reference voltage generation means driven by said power supply voltage for generating a reference voltage, driver means receiving said power supply voltage and supplying said power supply voltage, dividing means for dividing the power supply voltage supplied by said driver means and supplying a divided output voltage, comparison means for comparing said divided output voltage supplied by said dividing means and the reference voltage generated by said reference voltage generation means and controlling said driver means based on the difference between said divided output voltage and said reference voltage, and adjustment means for adjusting the dividing ratio of said dividing means.

26. A semiconductor device as recited in claim 25, wherein said dividing means includes first and second resistor means connected in series, and said adjustment means includes changing means for changing the resistance value of said first or second resistor means.

* * * * *